US005126206A

United States Patent [19]
Garg et al.

[11] Patent Number: 5,126,206
[45] Date of Patent: Jun. 30, 1992

[54] DIAMOND-ON-A-SUBSTRATE FOR ELECTRONIC APPLICATIONS

[75] Inventors: Diwakar Garg, Macungie, Pa.; Wilman Tsai, Cupertino, Calif.; Robert L. Iampietro, Emmaus, Pa.; Fred M. Kimock, Macungie, Pa.; Paul N. Dyer, Allentown, Pa.

[73] Assignee: Diamonex, Incorporated, Allentown, Pa.

[21] Appl. No.: 578,637

[22] Filed: Sep. 6, 1990

Related U.S. Application Data

[63] Continuation-in-part of Ser. No. 497,161, Mar. 20, 1990, abandoned.

[51] Int. Cl.⁵ ............................................ B32B 7/00
[52] U.S. Cl. ................................. 428/408; 428/332; 428/457; 428/698
[58] Field of Search ............... 428/408, 698, 332, 457, 428/216, 212

[56] References Cited

U.S. PATENT DOCUMENTS

| | | | |
|---|---|---|---|
| 4,643,741 | 2/1987 | Yu et al. | 51/295 |
| 4,698,256 | 10/1987 | Giglia et al. | 428/408 |
| 4,725,345 | 2/1988 | Sakamoto et al. | 428/408 |
| 4,731,296 | 3/1988 | Kikuchi et al. | 428/408 |
| 4,783,368 | 11/1988 | Yamamoto et al. | 428/408 |
| 4,873,115 | 10/1989 | Matsumura et al. | 428/408 |
| 4,900,628 | 2/1990 | Ikegaya et al. | 428/408 |

FOREIGN PATENT DOCUMENTS

0161829 11/1985 European Pat. Off.
1106494 5/1986 Japan.
2196371 8/1987 Japan.

OTHER PUBLICATIONS

English Translation of JP 63-307196 (published Dec. 14, 1988).
Matsumoto et al., "Vapor Deposition of Diamond Particles from Methane", Jap. Jour. of Appl. Pys., vol. 21, No. 4, Apr. 1982, pp. L183-L185.
Singh et al., "Growth of Polycrystalline Diamond Particles & Films by Hot-Filament CVD", J. Vac. Sci. Tech., 1988.
Kobashi et al., "Synthesis of Diamond by Use of Microwave Plasma Chemical Vapor Deposition: Morphology and Growth of Diamond Films", pp. 4067-4084 & Physical Review Bulletin of the American Physical Society, vol. 38(6), 1988.
Matsumoto et al., "Chemical Vapor Deposition of Diamond from Methane-Hydrogen Gas": Proc. 7th ICVM: Tokyo, Japan, pp. 386-391, (1982).

Primary Examiner—Patrick J. Ryan
Assistant Examiner—Archene Turner
Attorney, Agent, or Firm—McCubbrey, Bartels, Meyer & Ward

[57] ABSTRACT

A coated substrate product is disclosed which comprises a substrate and a polycrystalline diamond layer having a smooth surface finish, enhanced crystal orientation in comparison to industrial grade diamond powder particularly in the (220) and (400) directions, and excellent electrical and thermal properties. Also disclosed is a method for fabricating such a coated substrate in which the polycrystalline diamond layer is chemically vapor deposited onto the substrate at substrate temperatures in the range of 650° to 825° C.

25 Claims, 24 Drawing Sheets (EXAMPLE C)

(EXAMPLE E)

FIG. 5 (EXAMPLE F)

(EXAMPLE H)

(EXAMPLE K)

(EXAMPLE L)

FIG. 10 (EXAMPLE M)

FIG. 11 (EXAMPLE IV)

FIG. 12 (EXAMPLE O)

(EXAMPLE N)

(EXAMPLE O)

(EXAMPLE A)

(EXAMPLE B)

(EXAMPLE C)

(EXAMPLE D)

(EXAMPLE E)

(EXAMPLE F)

(EXAMPLE G)

(EXAMPLE H)

(EXAMPLE I)

(EXAMPLE J)

(EXAMPLE K)

(EXAMPLE L)

(EXAMPLE M)

(EXAMPLE P)

(EXAMPLE Q)

DIAMOND-ON-A-SUBSTRATE FOR ELECTRONIC APPLICATIONS

FIELD OF THE INVENTION

This application is a continuation-in-part of U.S. application Ser. No. 497,161, filed Mar. 20, 1990 now abandoned. This invention relates generally to the manufacture of integrated circuit devices. More particularly, the invention relates to a coated substrate product comprised of a substrate and a polycrystalline diamond (PCD) layer with an enhanced, that is, at least partially ordered crystal orientation and high electrical resistivity, and to a method for producing same.

BACKGROUND OF THE INVENTION

Very Large Scale Integrated (VLSI) circuit devices have become so dense that, for example, semiconductor circuits smaller than 1.0 micrometers are now being employed. One of the drawbacks of increasing the density of an integrated circuit device is the difficulty of maintaining electrical isolation of one circuit from another. When one circuit inadvertently couples electrically with another circuit, the device will malfunction and a fault will be recorded. This type of failure occurs in normal operation and to a greater degree when radiation is also present, such as in communication satellites. The other drawback of increasing the density of an integrated circuit is insufficient dissipation of heat generated by the chip, resulting in a rise of junction temperature. This rise in junction temperature reduces efficiency and reliability, and sometimes causes the chip to short circuit.

In an effort to improve electrical isolation between circuits and heat dissipation efficiency of the chip, the electronics industry has been experimenting with multilayer composite structures coated with one or more layers of PCD. These PCD films have been successfully deposited using a number of chemical vapor deposition (CVD) techniques including hot filament CVD (HFCVD), RF plasma-assisted CVD, microwave plasma-assisted CVD, DC plasma assisted CVD, DC plasma jet, and laser-assisted CVD. The electrical properties such as resistivity and breakdown voltage of PCD layers deposited by the above techniques have generally been low and therefore unacceptable to the electronics industry.

A number of technical papers and patents have been published which describe the deposition and properties of PCD produced by various techniques. For example, technical papers by B. V. Spitsyn, et al., entitled, "Vapor Growth of Diamond on Diamond and Other Surfaces", published in *Journal of Crystal Growth*, Vol. 52, pp. 219-226 (1981), D. V. Fedoseev, et al., entitled "Synthesis of Diamond in Its Thermodynamic Metastability Region", published in *Russian Chemical Reviews*, Vol. 53(5), pp. 435-444 (1984), and B. V. Derjaguin and D. B. Fedoseev entitled "The Synthesis of Diamond at Low Pressure", Scientific American, Vol. 233(5), pp. 102-9 (1975), discussed diamond deposition on a number of substrates. These papers neither disclose nor suggest a process of depositing diamond film with enhanced, that is, at least partially ordered crystal orientation and consequently the authors of these papers had no concept of the advantages of such a process.

M. W. Geis has described deposition of (111) textured diamond films on smooth substrates using diamond seeds in a paper entitled "Growth of Textured Diamond Films on Foreign Substrates from Attached Seed Crystals," published in *Appl. Phys. Lett.*, Vol. 55(6), pp. 550-552 (1989). This paper does not describe a process for depositing diamond with enhanced crystal orientation in the (220) or (311) and (400) directions relative to the (111) directions, or with high electrical resistivity.

U.S. Pat. No. 4,434,188, issued 28 Feb. 1984 and a paper by K. Ito, et al. entitled, "Diamond Synthesis by the Microwave Plasma CVD Method Using a Mixture of Carbon Monoxide and Hydrogen Gas (I)", published in *Chemistry Letters*, pp. 589-592 (1988) describe the deposition of diamond films by microwave plasma CVD technique using mixtures of either hydrogen and hydrocarbon or hydrogen and carbon monoxide. These references do not disclose the deposition of diamond films with enhanced crystal orientation and high resistivity.

A technical paper by B. Singh, et al. entitled, "Hollow Cathode Plasma Assisted Chemical Vapor Deposition of Diamond", published in *Appl. Phys. Lett.*, Vol. 52(20), pp. 1658-1660 (1988) describes the deposition of diamond films by hot cathode plasma CVD using a mixture of hydrogen and hydrocarbon. European Patent Publication No. 0320657, published 21 Jun. 1989, discloses deposition of diamond films using a combination of hot filament and microwave CVD techniques. These references do not disclose a process for depositing diamond films with enhanced crystal orientation or with high electrical resistivity.

A. Sawabe, et al., describe deposition of diamond films by DC plasma CVD using a mixture of hydrogen and methane in a paper entitled, "Growth of Diamond Thin Films in a DC Discharge Plasma", published in *Applied Surface Science*, Vol. 33/34, pp. 539-545 (1988). This paper does not disclose a process for depositing diamond films with enhanced crystals orientation or with high electrical resistivity.

Japanese Kokai Patent No. Sho 64(1989)-65092, published 10 Mar. 1989, and Japanese Kokai Patent No. Sho 62(1987)-202897, published 7 Sep. 1987, describe processes for depositing thin and adherent diamond films on substrates using a metal or metal carbide interlayer deposited on the substrates by PVD. Japanese Kokai Patent No. Sho 64(1989)-61397, published 8 Mar. 1988, describes a process of depositing thin diamond films adherently on cutting tools by first embedding fine diamond particles on tool substrates. These patent applications neither describe a process for depositing diamond films with enhanced crystal orientation nor discuss the advantages of these films.

A number of technical papers by S. Matsumoto, et al. entitled, "Growth of Diamond Particles from Methane-Hydrogen Gas", published in *J. Materials Service*, Vol. 17, pp. 3106-3112 (1982), "Chemical Vapor Deposition of Diamond From Methane-Hydrogen Gas", published in *Proc. 7th ICVM*, Tokyo, Japan, pp. 386-391 (1982), and "Vapor Deposition of Diamond Particles from Methane," published in *Japanese Journal of Applied Physics*, Vol. 21, No. 4, pp. L183-L185 (1982), describe deposition of diamond films by a hot filament CVD technique. Technical papers by B. Singh, et al. entitled, "Growth of Polycrystalline Diamond Particles and Films by Hot-Filament Chemical Vapor Deposition", submitted for publication in *J. Vac. Sci. Tech.* (1988) and "Effects of Filament and Reactor Wall Materials in Low-Pressure Chemical Vapor Synthesis of Diamond", published in *Appl. Phys. Lett.*, Vol. 52(6), pp. 451-452

(February, 1988) also describe deposition of diamond films by the hot filament CVD technique. None of the foregoing papers disclose a process for depositing diamond films with either enhanced crystal orientation or high electrical resistivity.

P. O. Joffreau, et al. disclose a hot filament CVD process for depositing diamond films on refractory metals in a paper entitled, "Low-Pressure Diamond Growth on Refractory Metals", published in *R&HM*, pp. 186-194 (December 1988). Another paper by T. D. Moustakas, entitled, "The Role of the Tungsten Filament in the Growth of Polycrystalline Diamond Films by Filament Assisted CVD of Hydrocarbons", published in *Solid State Ionics*, Vol, 32/33, pp. 861-868 (1989) describes an HFCVD process for depositing diamond films. These papers, once again, do not disclose a process for depositing diamond films with either enhanced crystal orientation or high electrical resistivity.

A technical paper by E. N. Farabaugh, et al. entitled, "Growth of Diamond Films by Hot Filament Chemical Vapor Deposition", published in *SPIE*, Vol. 969 *Diamond Optics*, pp. 24-31 (1988), discloses a process for depositing diamond films by HFCVD. These diamond films were deposited using a wide range of temperature, analyzed by x-ray diffraction and shown to have no preferred crystal orientation. Therefore, this paper does not disclose a process for depositing diamond films with either enhanced crystal orientation or high electrical resistivity.

U.S. Pat. Nos. 4,707,384 and 4,734,339 disclose an HFCVD process for depositing one or more polycrystalline diamond layers on a variety of substrates. These patents do not disclose a process for depositing diamond films with enhanced crystal orientation or with high electrical resistivity.

Japanese Kokai Patent No. Sho 62(1987)-119, published 6 Jan. 1987, discloses a HFCVD process for depositing diamond films on substrates with a variety of interlayers. Japanese Kokai Patent No. Sho 62(1987)-171993, published 28 Jul. 1987, discloses a CVD process for depositing diamond films using a mixture of an organic compound and a reaction gas containing at least one species of boron, aluminum, gallium, indium, thallium, nitrogen, phosphorus, arsenic, antimony or bismuth. Japanese Kokai Patent No. Sho 63(1988)-297299, published 5 Dec. 1988, discloses a process for depositing diamond films using a mixture of hydrogen, hydrocarbon, chlorine and inert gas. Japanese Kokai Patent No. Sho 63(1988)-153815, published 27 Jun. 1988, discloses a HFCVD process for depositing diamond films using tungsten filament. None of the foregoing patent applications disclose processes for depositing diamond films with either enhanced crystal orientation or high electrical resistivity.

Japanese Kokai Patent No. Sho 63(1988)-166797, published 9 Jul. 1988, discloses the use of filaments made of an alloy of Ta, Zr and/or Hf for enhancing filament life during HFCVD process. This application does not disclose the deposition of diamond films with enhanced crystal orientation or with high electrical resistivity.

Japanese Kokai Patent No. Sho 63(1988)-159292, published 2 Jul. 1988, discloses a DC current biased HFCVD process for depositing diamond films on a substrate with a large surface area or with a curved surface. It does not disclose the formation of diamond films with enhanced crystal orientation or with high electrical resistivity.

R. G. Buckley, et al. disclose an HFCVD process for depositing diamond films in a paper entitled, "Characterization of Filament-Assisted Chemical Vapor Depositing Diamond Films Using Raman Spectroscopy", published in *J. Appl. Phys.*, 66 (8), 3595-3599 (1989). T. Kawato and K. Kondo disclose the effect of adding oxygen along with feed gas mixture upon diamond films deposited by HFCVD in a paper entitled, "Effect of Oxygen on CVD Diamond Synthesis", published in *Japanese Journal of Applied Physics*, Part I, Vol. 2 (9), pp. 1429-1432 (1987). These papers do not disclose a method for depositing diamond films with either enhanced crystal orientation or high electrical resistivity.

U.S. Pat. No. 4,816,286 and a paper by Y. Hirose and Y. Terasawa entitled, "Synthesis of Diamond Thin Films by Thermal CVD Using Organic Compounds", published in *Japanese Journal of Applied Physics*, Vol. 25(6), pp. L519-L521 (1986) disclose a CVD method for depositing diamond films using a mixture of hydrogen and an organic compound containing carbon, hydrogen, and at least one of oxygen and nitrogen. Japanese Kokai Patent No. Sho 64(1989)-24093, published 26 Jan. 1989, discloses a CVD method of depositing diamond films using a mixture of an organic compound and water vapors. Japanese Kokai Patent No. Sho 63(1988)-307195, published 14 Dec. 1988, discloses a CVD method of depositing diamond films using a mixture of an organic compound and a raw gas containing ammonia. These references do not describe a method of depositing diamond films with either enhanced crystal orientation or with high electrical resistivity.

U.S. Pat. No. 4,859,490 and European Patent Publication Nos. 0 254 312 and 0 254 560 disclose HFCVD processes for depositing diamond films. These references teach that diamond films with high electrical resistivity can not be produced by HFCVD, and that high resistivity diamond films can only be produced by using a combination of hot-filament and plasma generated by either microwave or DC discharge during chemical vapor deposition. These patents teach away from using an HFCVD process to produce diamond films having enhanced crystal orientation and high electrical resistivity.

U.S. Pat. No. 4,783,368 makes reference in column 2, lines 22-32, to the very poor electrical insulating properties, particularly dielectric breakdown, that are obtained when thin layers of polycrystalline diamond are deposited by CVD techniques. This reference goes on to describe and claim a method of producing an insulating layer comprising a diamond or diamond-like carbon material and an element from group IVA on a substrate by applying DC voltage and RF power to the substrate and a magnetic field parallel to the substrate's surface. Examples are given in which the transmission electron diffraction of the diamond-like carbon layers corresponded to (111) and (220) of natural diamond. This patent does not disclose a process for depositing diamond films with enhanced crystal orientation.

Japanese Kokai patent No. Sho 63(1988)-307196, published 14 Dec. 1988, discloses a plasma CVD process for depositing multilayered diamond films. The first layer deposited on the substrate is made of microcrystal diamond and the second layer deposited on the top of the first layer is formed with crystalline facet with (110) or (220) orientation. The application discloses that if the methane concentration in the feed gas is smaller than about 1%, the deposited films have randomly oriented crystals. However, if the concentration of methane is higher than 1%, the films show enhanced crystal orientation in the (220) direction. The deposited films are disclosed to have good thermal conductivity. This patent does not disclose a process for depositing diamond films either with enhanced crystal orientation in both the (220) or (311) direction and the (400) direction, or with high electrical resistivity.

K. Kobashi, et al., disclose a microwave plasma CVD process for depositing diamond films with enhanced crystals orientation in (100) or (400) direction in papers entitled, "Synthesis of Diamonds by Use of Microwave Plasma Chemical Vapor Deposition: Morphology and Growth of Diamond Films", published in *Physical Review Bulletin of the American Physical Society*, Vol. 38(6), pp. 4067-4084 (1988) and entitled "Summary Abstract: Morphology and Growth of Diamond Films", published in *J. Vac. Sci. Techn.* Vol. A6(3), pp. 1816-1817 (1980). These papers disclose depositing films with (111) crystal orientation at methane concentration <0.4% and films containing diamond crystals oriented in (100) direction at methane concentration above 0.4%. The films deposited at methane concentration ~1.6% have been shown to be structureless. W. Zhu, et al., disclose a microwave plasma CVD process for depositing diamond films with enhanced crystals orientation in either (111) or (100) directions in a paper entitled, "Effects of Process Parameters on CVD Diamond Films", published in *J. Mater. Res.*, Vol. 4(3), pp. 659-663 (1989). This paper discloses the disposition of diamond films with enhanced crystals orientation in (110) direction with less than 2% methane in hydrogen at temperatures between 910°-950° C. A higher temperature (>1000° C.) is claimed to favor the formation of crystals oriented in the (111) direction. An intermediate temperature (950°-1000° C.) has been shown to favor formation of crystals oriented in (111) and (100) directions with neither predominating. N. Setaka discloses a CVD method of depositing diamond films in a paper entitled, "Diamond Synthesis From Vapor Phase and its Growth Process", published in *J. Mater. Res.*, Vol. 4, No. 3, pp. 664-670 (1989). The paper discloses that films deposited with 0.5% methane contained crystal oriented in (111) and (100) directions. It also discloses that as the methane concentration approaches 3%, a remarkable enhancement of crystal orientation in (220) direction relative to (111) is observed. Despite the fact that the authors of these papers have recognized enhanced crystal orientation in one plane relative to (111) plane, none of them disclose the formation of diamond films with enhanced crystal orientation in at least two planes relative to (111) plane nor a process for achieving diamond films having such crystal orientation as well as high electrical resistivity.

Although the polycrystalline diamond films deposited by the techniques described in the foregoing references have been shown to have good thermal conductivity, i.e., of not less than 50 W/mk, their use in the electronic industry has been limited due to poor electrical properties. Several attempts have been made by numerous researchers to produce polycrystalline diamond films with good electrical properties, but with limited success. For example, in two recent papers by K. V. Ravi and M. I. Landstrass one entitled "Silicon on Insulator Technology using CVD Diamond Films", published in *PMAC, Electrochem Soc.*, 24-37 (1989) and the other entitled, "Resistivity of Chemical Vapor Deposited Diamond Films", published in *Appl. Phys. Letter*, Vol. 55(10), pp. 975-977(1989), it is disclosed that the poor electrical properties of DC plasma and microwave plasma deposited polycrystalline diamond films are due to the presence of dissolved hydrogen. The authors disclose that the dissolved hydrogen can be removed from the films by annealing, thereby improving the electrical properties. The authors neither present the electrical properties of hot-filament deposited polycrystalline diamond films nor describe the effect of annealing on the electrical properties of HFCVD films. Furthermore, the authors do not disclose the formation of diamond films with enhanced crystal orientation.

Contrary to the teaching of K. V. Ravi and M. I. Landstrass, the diamond films deposited by HFCVD contain only trace amounts of hydrogen (compared to films deposited by DC plasma or microwave plasma CVD) to begin with and the annealing process only results in marginal improvements in their electrical properties. However, it has been found in the present invention that the electrical properties (i.e. electrical resistance and breakdown voltage) of polycrystalline diamond films can be significantly improved over such polycrystalline diamond systems of the prior art by depositing diamond crystals with enhanced orientation.

Further, the polycrystalline diamond films deposited by the prior art techniques have a poor surface finish due to the presence of randomly oriented faceted crystals. Thus, the surface finish of polycrystalline diamond films can also be significantly enhanced by depositing diamond crystals with enhanced orientation on at least two planes.

SUMMARY OF THE INVENTION

The improved multi-layer composite structure of the present invention substantially reduces or eliminates the disadvantages and shortcomings associated with the prior art techniques. The invention discloses a coated substrate product comprised of a parent substrate and a polycrystalline diamond layer having enhanced, that is, at least partially ordered crystal orientation on at least two planes over industrial grade of diamond powder to provide (i) superior electrical isolation of one electronic device from another and from the base substrate, and (ii) excellent surface finish.

The invention also comprises a method for fabricating the substrate product. According to the method, the polycrystalline diamond layer is chemical vapor deposited on the substrate by the HFCVD technique with predetermined deposition parameters, such that the polycrystalline diamond film is deposited with an enhanced crystal orientation and excellent electrical properties and surface finish. The intensity of (HKL) reflection in the (220) or (311) direction and the (400) direction relative to (111) of the film of the present invention are enhanced over that of industrial grade of diamonds. The diamond films of this invention exhibit particularly high electrical resistivity and breakdown voltage.

BRIEF DESCRIPTION OF THE DRAWINGS

Further features and advantages will become apparent from the following and more particular description of the preferred embodiment of the invention as illustrated in the accompanying drawings, in which.

DETAILED DESCRIPTION OF THE INVENTION

Figure 1:
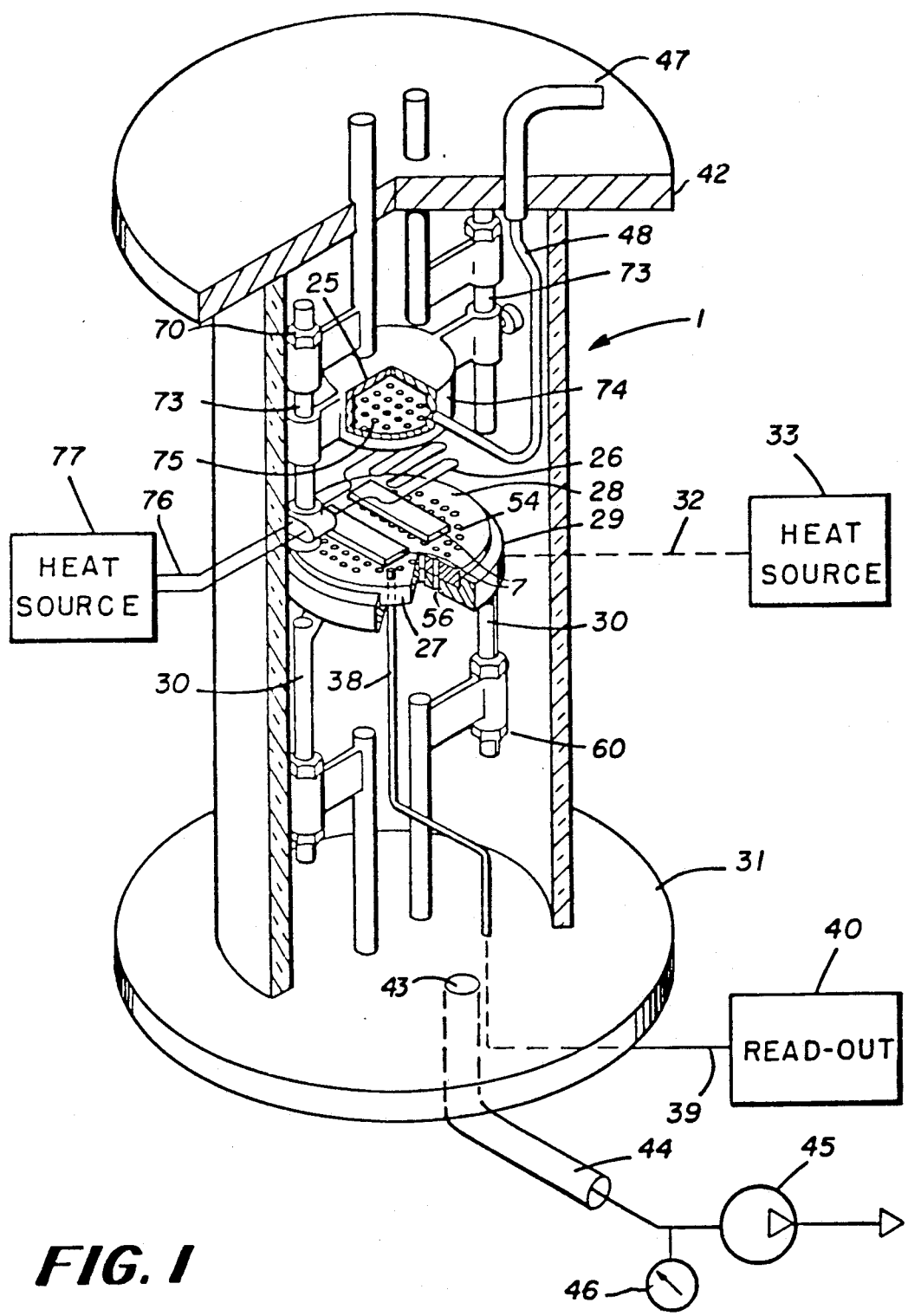
FIG. 1 is a simplified sectional view of a type of HFCVD reactor for use in carrying out the method of the present invention.
Figure 2:
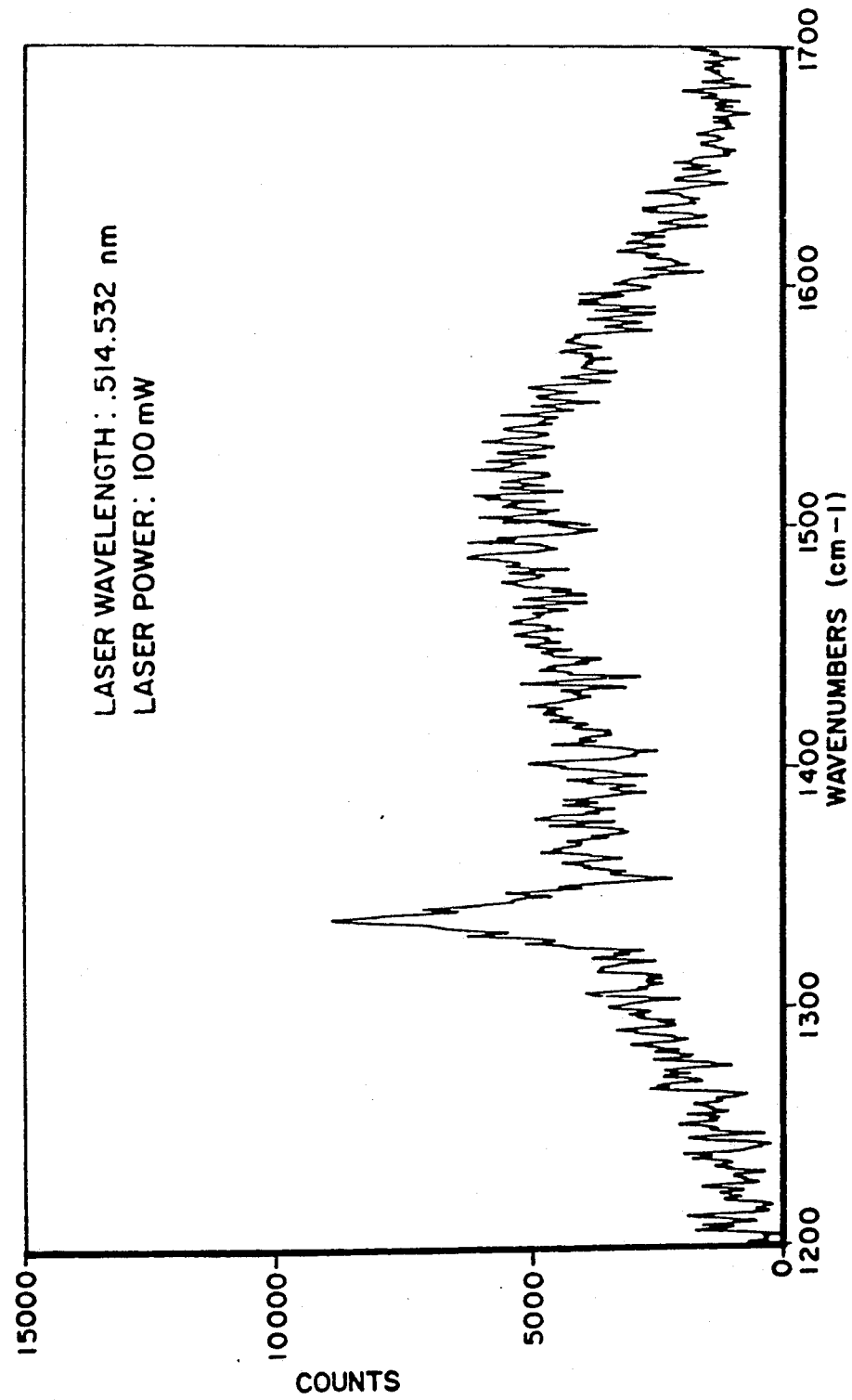
FIGS. 2-10 are Laser Raman spectra graphs of polycrystalline diamond films deposited by HFCVD on molybdenum according to the present invention.
Figure 3:
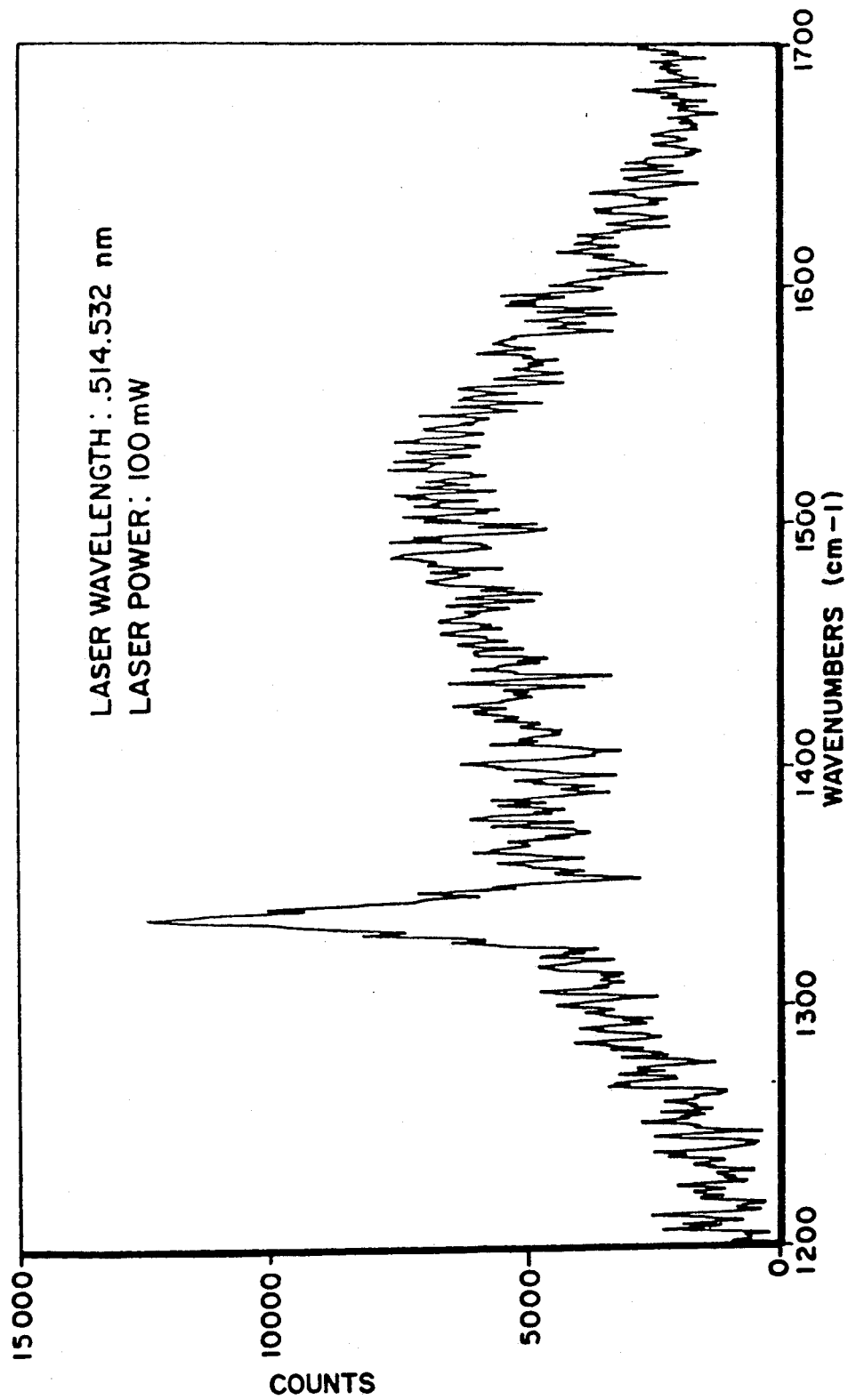
Figure 4:
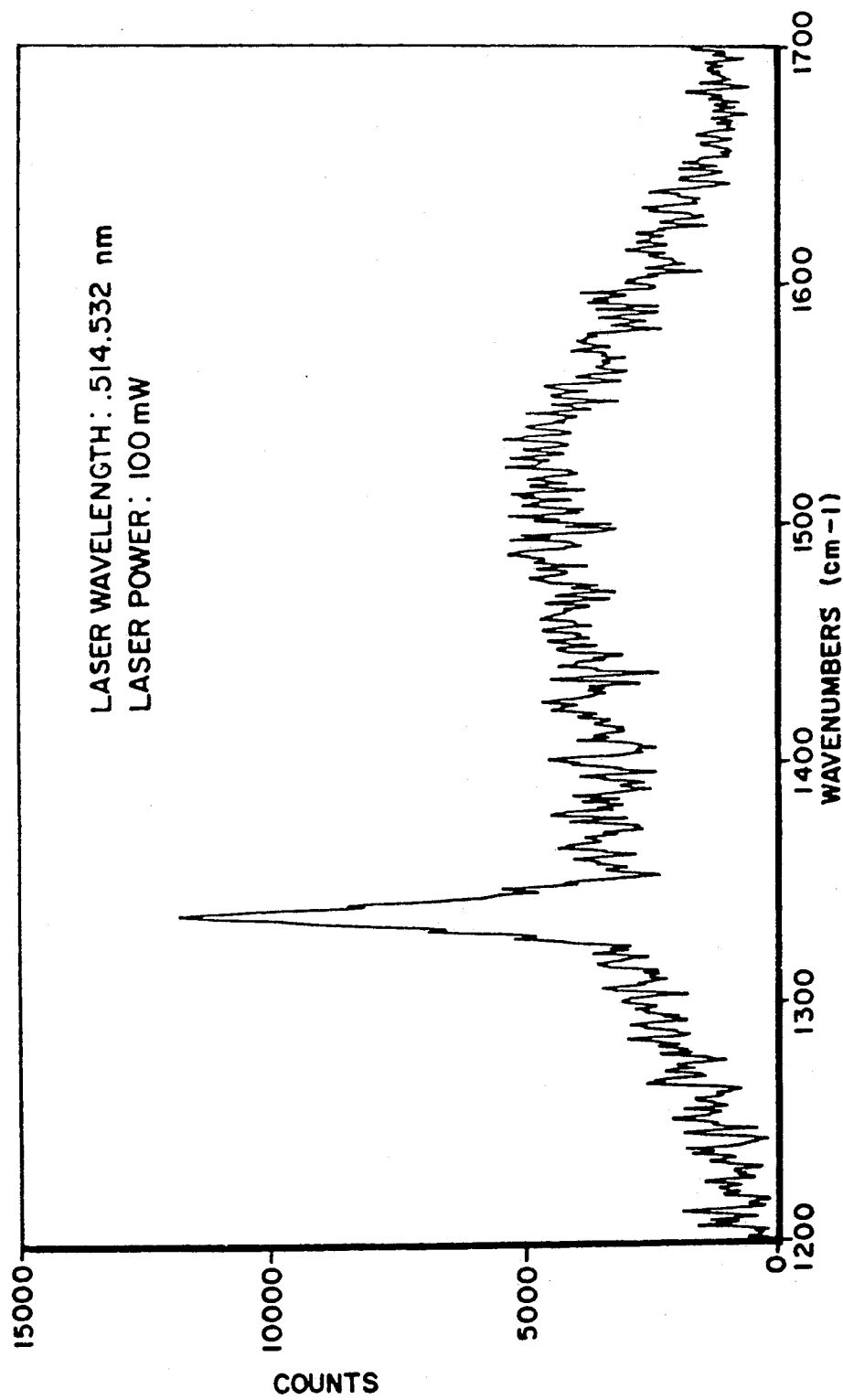
Figure 5:
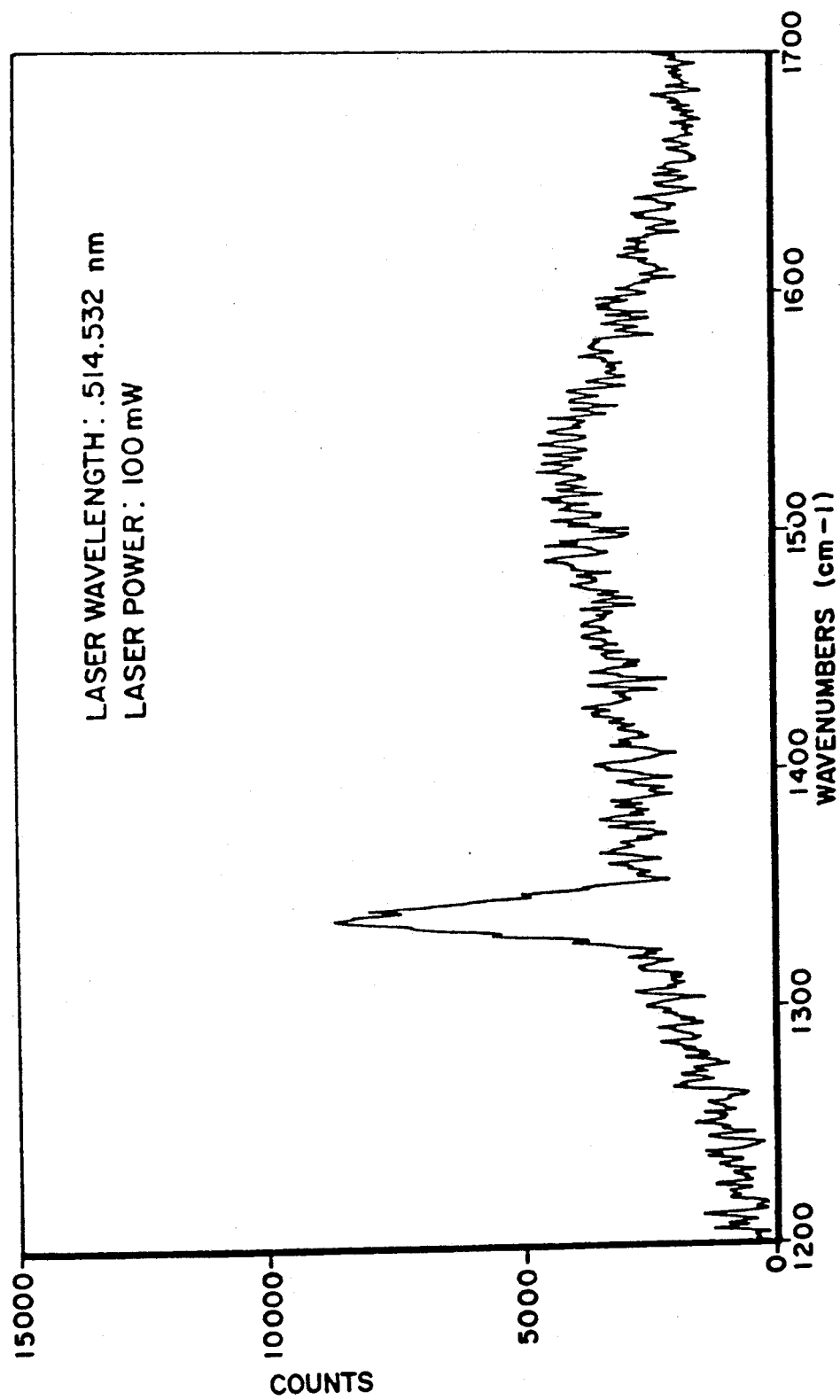
Figure 6:
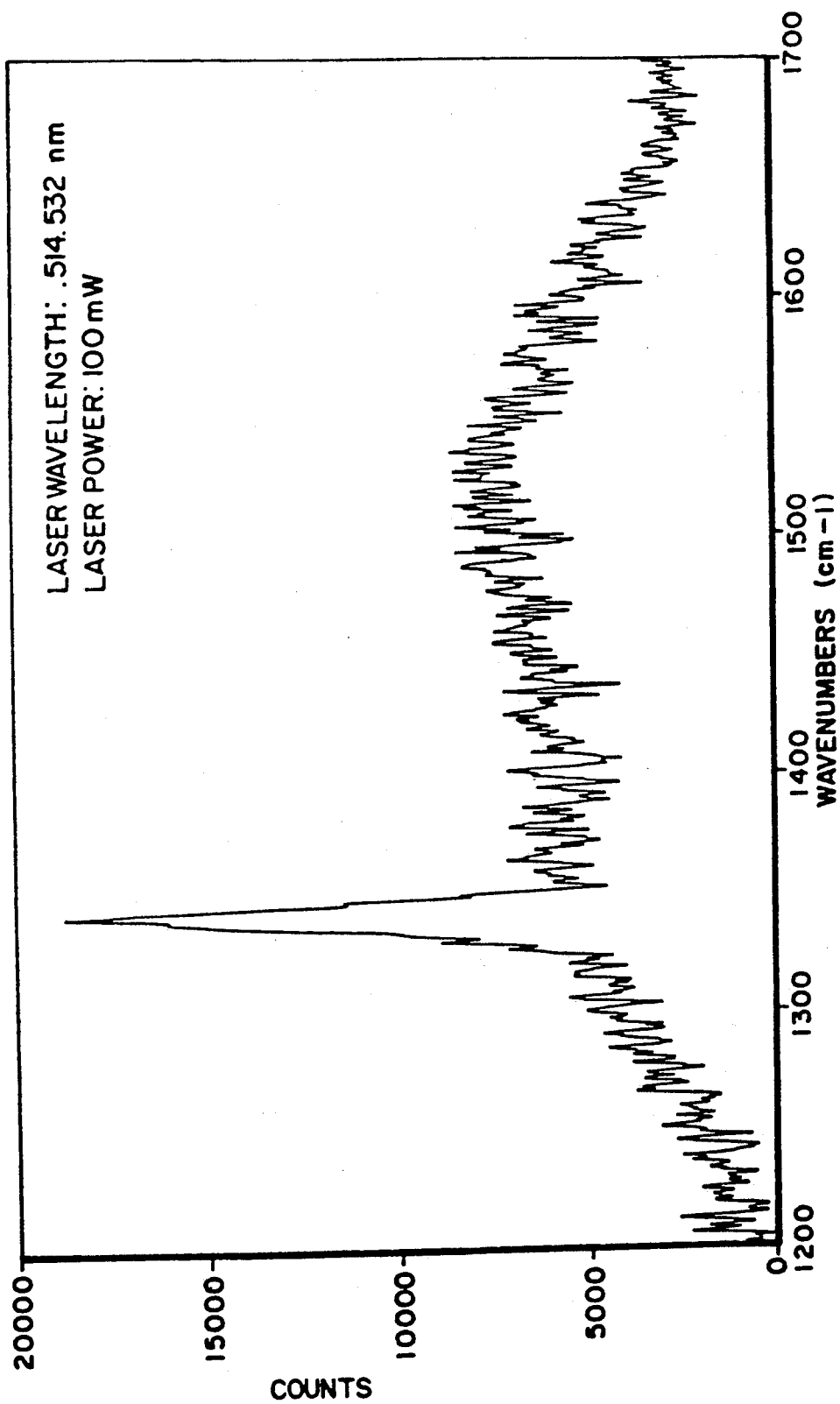
Figure 7:
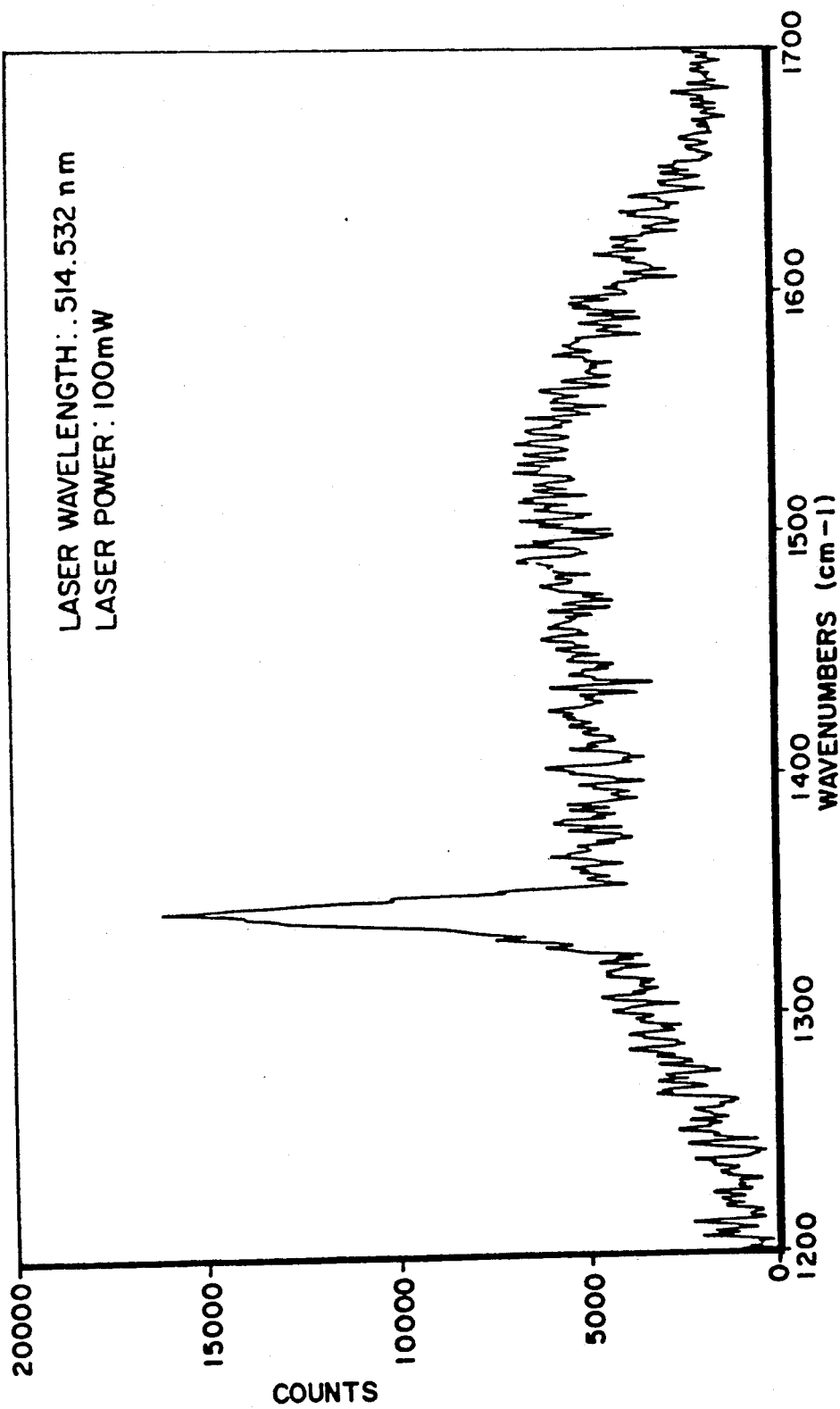
Figure 8:
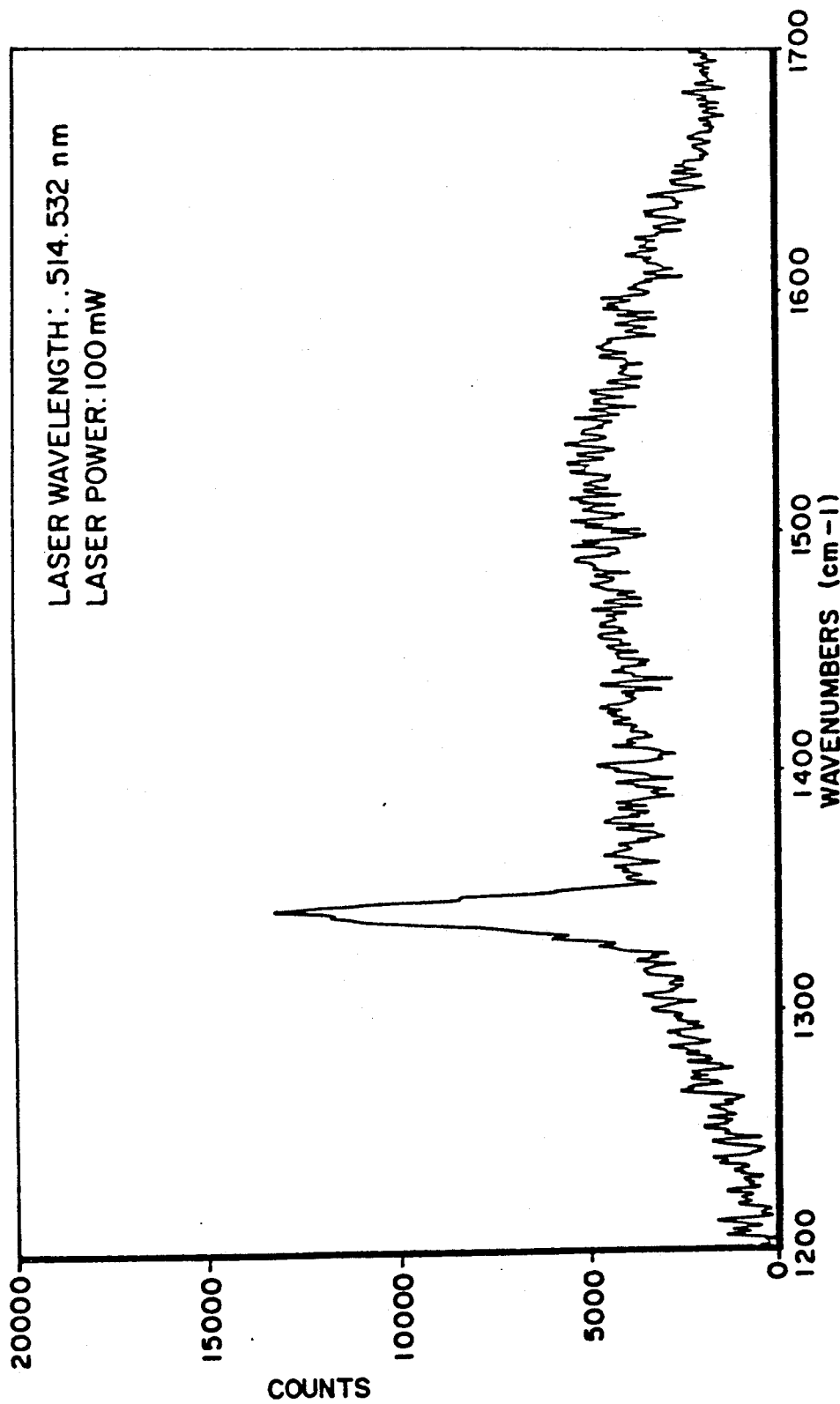
Figure 9:
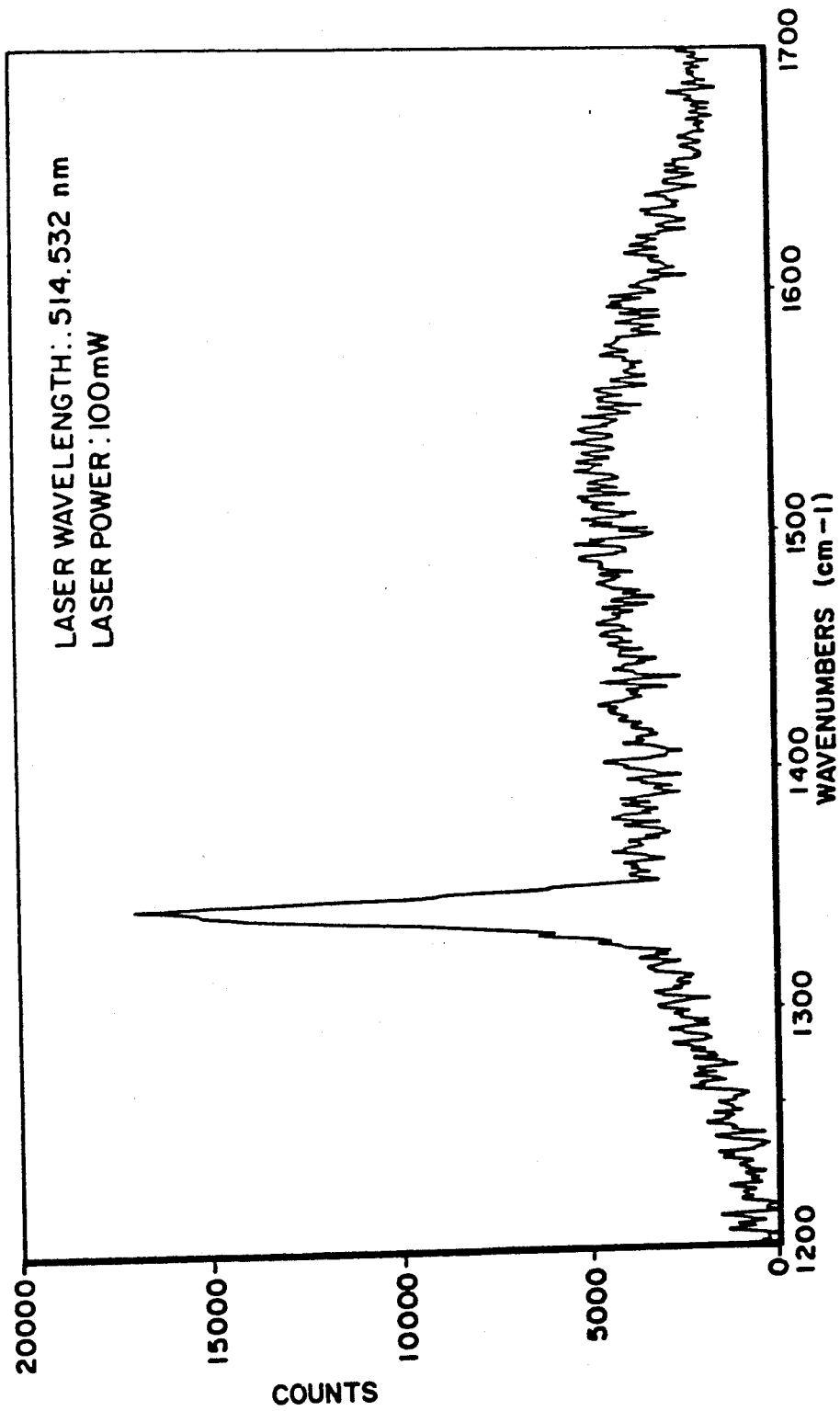
Figure 10:
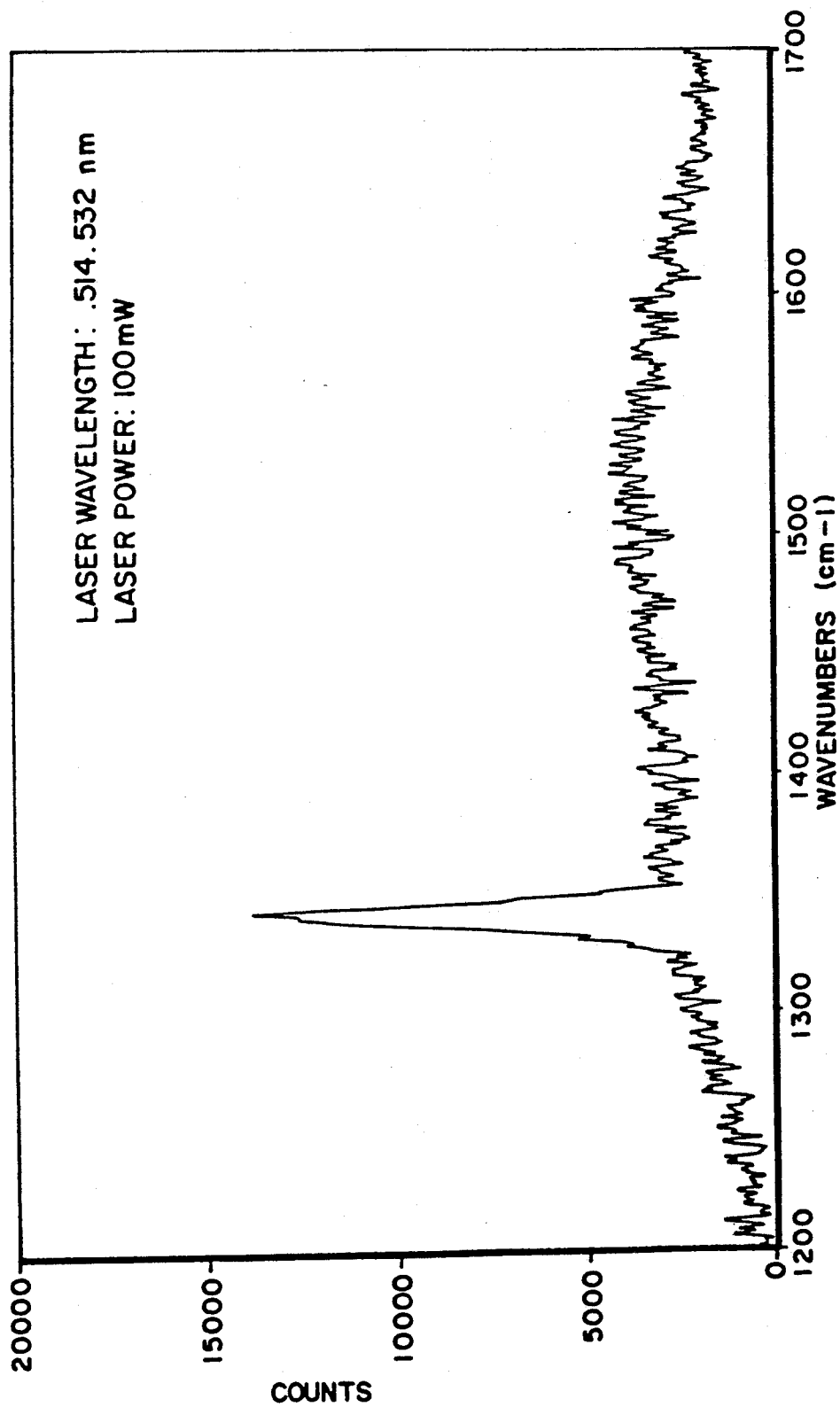

The composition of the present invention is a multilayer composite structure which comprises a parent substrate and a polycrystalline diamond layer. The substrate on which diamond film is deposited comprises a single crystal such as diamond, silicon carbide, silicon, sapphire, and similar materials; a polycrystalline material such as silicon; a metal such as tungsten, molybdenum, titanium, tantalum, copper, and the like; a mixture of metals such an tungsten and molybdenum, tungsten and copper, molybdenum and copper, and the like; a ceramic material such as hot pressed, sintered or chemically vapor produced ceramics including silicon carbide, silicon nitride, polycrystalline diamond, cemented carbides, alumina, and the like or mixtures thereof. The substrate may contain various other layers and structures which constitute integrated circuitry. Such layers and structures may be formed before or after the application of a polycrystalline diamond layer.

Preferably the polycrystalline diamond layer is chemically vapor deposited on the substrate by means of a conventional deposition technique such that the diamond layer exhibits an enhanced, that is, at least partially ordered crystal orientation in the (220) and the (400) directions. In particular the intensity of (HKL) reflection in the (220) and (400) directions are at least 47 and 12 percent, respectively relative to (111) intensity, which is normalized to 100, of the film of the present invention. The resulting structure thus enables the isolation of circuits and silicon devices from one another and from the base substrate via the high electrical insulating property and other superior electrical properties of the polycrystalline diamond layer and exhibits a superior surface finish by substantially reducing the faceted crystals.

The method of the present invention enables those skilled in the art to fabricate the substrate product of this invention. In the preferred embodiment of the invention, the polycrystalline diamond layer is chemically vapor deposited on a single crystal, a polycrystalline material, hard metal, metal alloy, mixture of metals, ceramic substrate or mixtures thereof, such that the polycrystalline diamond layer exhibits enhanced crystal orientation in either the (220) or the (311) direction and the (400) direction over that of industrial grade of diamonds. By the phrase "chemically vapor deposited," it is meant a layer of polycrystalline diamond resulting from the thermal decomposition of a mixture of hydrogen and carbon compounds, preferably hydrocarbons, into diamond generating carbon atoms preferentially from the gas phase activated in such a way as to avoid substantially the deposition of graphite carbon. The specific types of carbon compounds useful in this method include $C_1$-$C_4$ saturated hydrocarbons such as methane, ethane, propane and butane; $C_1$-$C_4$ unsaturated hydrocarbons such as acetylene, ethylene, propylene and butylene; gases containing C and O such as carbon monoxide and carbon dioxide; aromatic compounds such as benzene, toluene, xylene, and the like; and organic compounds containing C, H, and at least one of oxygen and/or nitrogen such as methanol, ethanol, propanol, dimethyl ether, diethyl ether, methylamine, ethylamine, acetone, and similar materials (a detailed list of organic compounds that can be used to deposit diamond layer with enhanced crystal orientation is provided in U.S. Pat. No. 4,816,286, which patent is incorporated herein by reference). The organic compound can be in admixture with water as described in Japanese Kokai Patent No. Sho 64(1989)-24093, published 26 Jan. 1989, which patent is incorporated herein by reference. The concentration of carbon compounds in the hydrogen gas can vary from about 0.1% to about 5%, preferably from about 0.2% to 3%, and more preferably from about 0.5% to 2%. The resulting diamond layer in such a deposition method is in the form of adherent individual crystallites or a layer-like agglomerates of crystallites substantially free from intercrystalline adhesion binders.

The polycrystalline diamond layer can be from 0.5 $\mu$m to 250 $\mu$m in thickness. Preferably, the thickness of the diamond layer is about 0.5 $\mu$m to about 50 $\mu$m in thickness. Still more preferably, it is about 3 $\mu$m to 15 $\mu$m.

The polycrystalline diamond film of the present invention may be deposited in the preferred method by using an HFCVD reactor such as reactor 1 illustrated in FIG. 1. The HFCVD technique involves activating a feed gaseous mixture containing a mixture of hydrocarbon and hydrogen by a heated filament and flowing the activated gaseous mixture over a heated substrate to deposit a polycrystalline diamond film. The feed gas mixture, containing from 0.1 to about 5% hydrocarbon in hydrogen, is thermally activated under sub-atmosphere pressure ($\leq$100 torr) to produce hydrocarbon radicals and atomic hydrogen by using a heated filament made of W, Ta, Mo, Re or a mixture thereof. The filament is electrically heated to a temperature ranging from about 1800° to 2250° C. The substrate on which the films is to be deposited is heated to a temperature ranging from about 650° to 825° C. The control of substrate of deposition temperature at or below 825° C. is critical for depositing polycrystalline diamond films with enhanced crystal orientation, excellent electrical properties, and excellent surface finish. The use of deposition temperatures above 825° C. has been found to result in polycrystalline diamond crystals with random orientation. The use of deposition temperatures below 650° C., on the other h and, has been found to result in deposition of diamond films at extremely low and impractical rates.

After a suitable period of diamond deposition time, the flow of the reactive gaseous mixture is stopped and an inert gas, i.e. argon, helium and the like, is passed over said coated substrate while the filament remains electrically charged for a period of time to purge the activated gaseous mixture from the reactor and then the coated substrate is cooled by removing the charge from the filament while continuing to pass the inert gas over the substrate.

Referring now to FIG. 1, HFCVD reactor 1 for chemical vapor depositing a diamond film onto substrates 7 comprises a gas dispersion system 25, a filament network 26 and an apertured support plate 27. Gas dispersion system 25 and apertured support plate 27 are oriented within reactor 1 so that their surfaces are perpendicular to the axis of the gas flow through the reaction zone 28. Substrates 7 to be coated are supported by the apertured support plate 27 which rests on an apertured substrate heater 29. Substrate heater 29 is attached to adjustable rods 30, which are mounted to the reactor base 31. Substrate heater 29 is provided with lead 32 to which an electrical heating current is conducted from suitable heat source 33. Substrate heater 29 is also provided with a thermocouple 38 to measure substrate temperature and a connecting electrical lead 39 through which the thermocouple output is transmitted to an external read-out or recorder/controller 40. To accurately record and control the temperature of the plurality of substrates 7 within the critical range of the method of the present invention, the tip of the thermocouple 38 is placed immediately adjacent to the top surface of one of the substrates, as shown in FIG. 1.

The ends of reactor 1 are enclosed by removable bottom plate 31 and top plate 42 which isolate reactor 1 such that the interior can be evacuated without significant inward leakage from the surrounding ambient atmosphere. In order to regulate the gas pressure within reactor zone 28 and remove reaction product gases, bottom plate 31 is provided with an opening 43 therein through which an exhaust port tube 44 is suitably connected to a vacuum pump 45. A vacuum gauge 46 is connected in the line thereto for indicating the pressure within the reactor chamber. By properly operating the vacuum pump 45, the gas pressure within the reactor chamber may be regulated as desired.

A gas inlet tube 47 is provided which extends through top plate 42. Gas inlet tube 47 is suitably connected to gas dispersion system 25 by means of a gas feed line 48. Gas inlet tube 47 is connected to a gas feed system (not shown) to introduce reactant gases into the reactor at desired flow rates.

Support plate 27 contains apertures 54 and heater 29 contains apertures 56 in heater 29 aligned with apertures 54 as shown in FIG. 1 to provide a means of flowing the reactant gas through the support plate 27 to reduce the extent of radial (stagnation point) flow adjacent to the substrates 7 and improving coating uniformity thereon. Support plate 27 and the substrate heater 29 assembly are provided with adjustable support rods 30 for varying the distance between substrates 7 and filament network 26, the support rods 30 consisting of threaded posts with lock nuts 60 removably secured thereon.

With the noted reactor apparatus, reactant gas is introduced into the reactor chamber through gas inlet tube 47 and gas feed line 48. Gas feed line 47 is connected to gas dispersion system 25 which introduces the reactant gas into reaction zone 28 of the reactor with substantially uniform axial gas velocity and temperature. Gas dispersion system 25 is supported within the reactor by a pair of adjustable rods 73, suitably connected to reactor cap 42; rods 73 consisting of threaded post with suitable lock nuts 70 removably secured thereon.

Gas dispersion system 25 consists of a thin housing 74 with an apertured bottom surface 75 to introduce and uniformly distribute the reactant gas over filament network 26.

Filament network 26 is also supported in reaction zone 28 by one of the adjustable rods 73. Filament network 26 is provided with lead 76 to which the heating current is conducted from a suitable heat source 77. Filament network 26 extends transversely in reaction zone 28 of the reactor and is oriented such that the maximum cross-sectional area of filament network 26 is perpendicular to the axis of the gas flow in reaction zone 28.

Additional details of the type of reactor system used in the method of the present invention are found in U.S. application Ser. No. 497,159, filed Mar. 20, 1990; the detailed description of which is incorporated herein by reference.

A particular advantage of the structure and method of the present invention lies in the fact that the polycrystalline diamond layer is chemically vapor deposited on the substrate such that the polycrystalline diamond layer exhibits enhanced crystals orientation in the (220) or (311) direction and the (400) direction relative to (111) direction. Some of the diamond layers exhibit enhanced crystals orientation in the (311) direction in addition to the (220) and (400) directions. As a result, the polycrystalline diamond layer exhibits a particularly high electrical resistivity, i.e. greater than $10^6$ ohm-cm., a high breakdown voltage, i.e. greater than 100 volts, and a superior surface finish, representing a significant improvement over the prior art.

The controls and examples which follow illustrate the method of the invention and of the coated substrate products produced thereby. The examples are for illustrative purposes only and are not meant to limit the scope of the claims in any way.

PRE-CONDITIONING OF A NEW FILAMENT

A new tantalum filament made of 1 mm diameter and 21.6 cm long wire was fabricated and placed in the small scale HFCVD reactor described above. The total surface area of the filament was $\sim 8.5$ cm$^2$. It was carburized in the reactor using a preferred procedure. The procedure involved heating the filament to $\sim 1800°$ C. in the presence of 100 sccm flow of 1% $CH_4$ in $H_2$ at 30 torr. The filament temperature was increased in steps of 50° C. every 30 minutes until a temperature of $\sim 2200°$ C. was reached. This temperature was maintained for 3? minutes. The temperature and flow rate of 1% $CH_4$ $H_2$ were then reduced to 2100° C. and 20 sccm, respectively, and maintained for another 12 hours. The filament power was then turned off and it was cooled in flowing helium gas. The surface of the filament was carburized well, as evidenced by gold color of TaC. No signs of filament bending were noted during and after carburization. Additionally, no signs of graphitic carbon deposit were seen on the filament.

The filament carburization procedure described above was used prior to using a new filament for depositing PCD films on metallic and ceramic substrates in all the controls and examples described below. In some of those controls and examples a used tantalum filament (filament used previously in depositing PCD films in one or more experiments) was utilized for depositing PCD films. In no case was a virgin tantalum filament used for depositing PCD films.

EXAMPLES A-M AND CONTROLS N-O

A number of polycrystalline diamond deposition experiments, as set forth in Table 1, were carried out in a HFCVD reactor of the type illustrated in FIG. 1. In these experiments, two 1.35 in. long×0.387 in. wide×0.062 in. thick molybdenum specimens were placed on a holder. The specimens were pre-etched with a slurry containing approximately 80 μm diamond particles in ethyl alcohol for a predetermined time in a ultrasonic bath. The specimens were then heated to a temperature ranging from 670° to 850° C. using a filament made of approximately 1 mm diameter tantalum wire, which was placed approximately 10 mm above the specimens. The filament was heated to a temperature ranging from 1850° to 2260° C. using an AC power supply. The filament temperature was determined by using a dual wavelength pyrometer. The substrate temperature, however, was determined by placing a thermocouple next to the top surface of one of the specimens, as shown in FIG. 1.

Reaction parameters set forth in Table 1 were used in these experiments. After deposition times of approximately 15 hours for all of the examples and controls, except for Example A in which the deposition time was approximately 19 hours, the flow of feed gas was switched from approximately 10 SCCM of 1% CH$_4$ in H$_2$ to approximately 50 SCCM of He. The filament power was turned off after approximately ½ hr. and the coated specimens were cooled under the flow of He gas.

Figure 11:
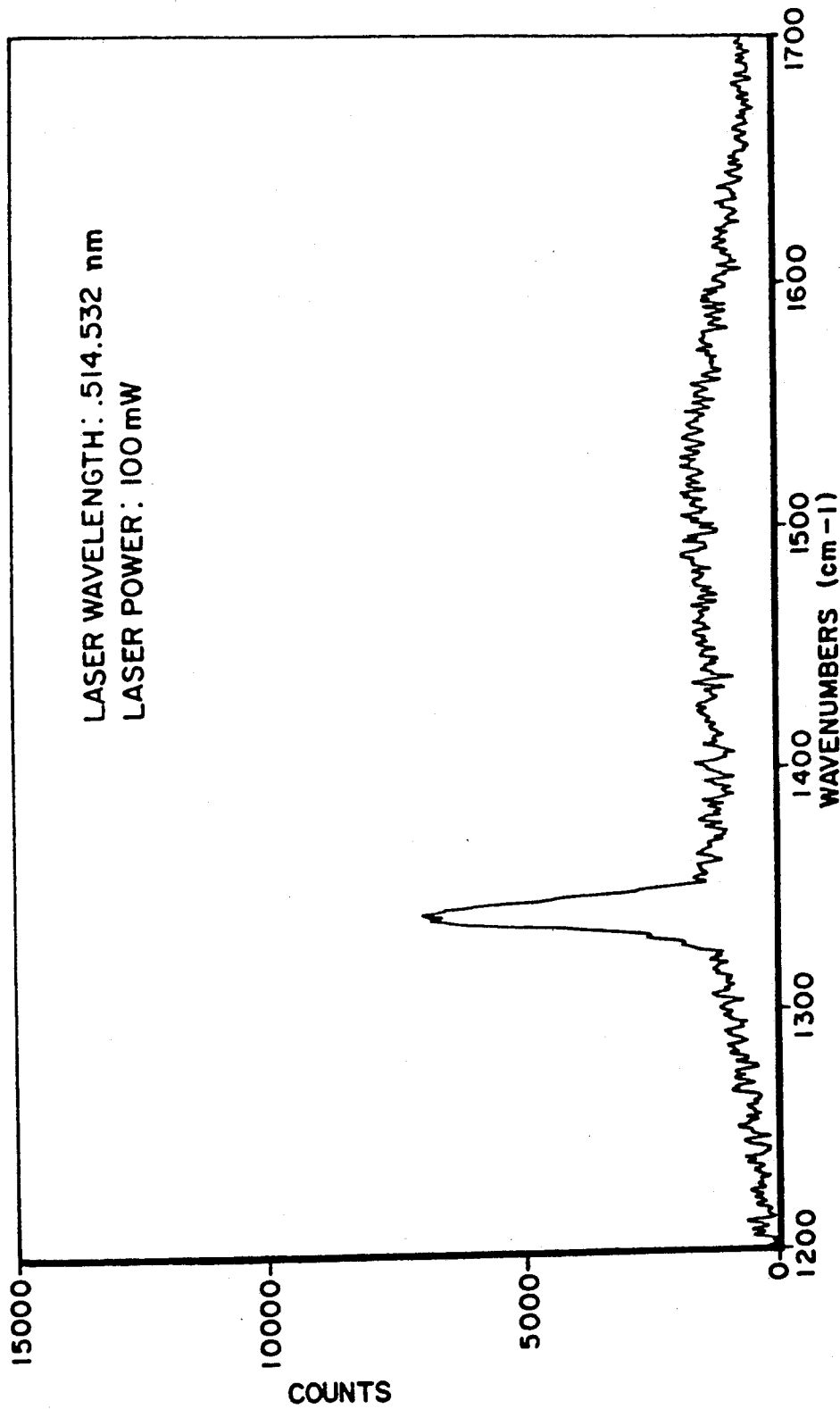
FIGS. 11-12 are Laser Raman spectra graphs of polycrystalline diamond films deposited by HFCVD on molybdenum according to the prior art techniques.
Figure 12:
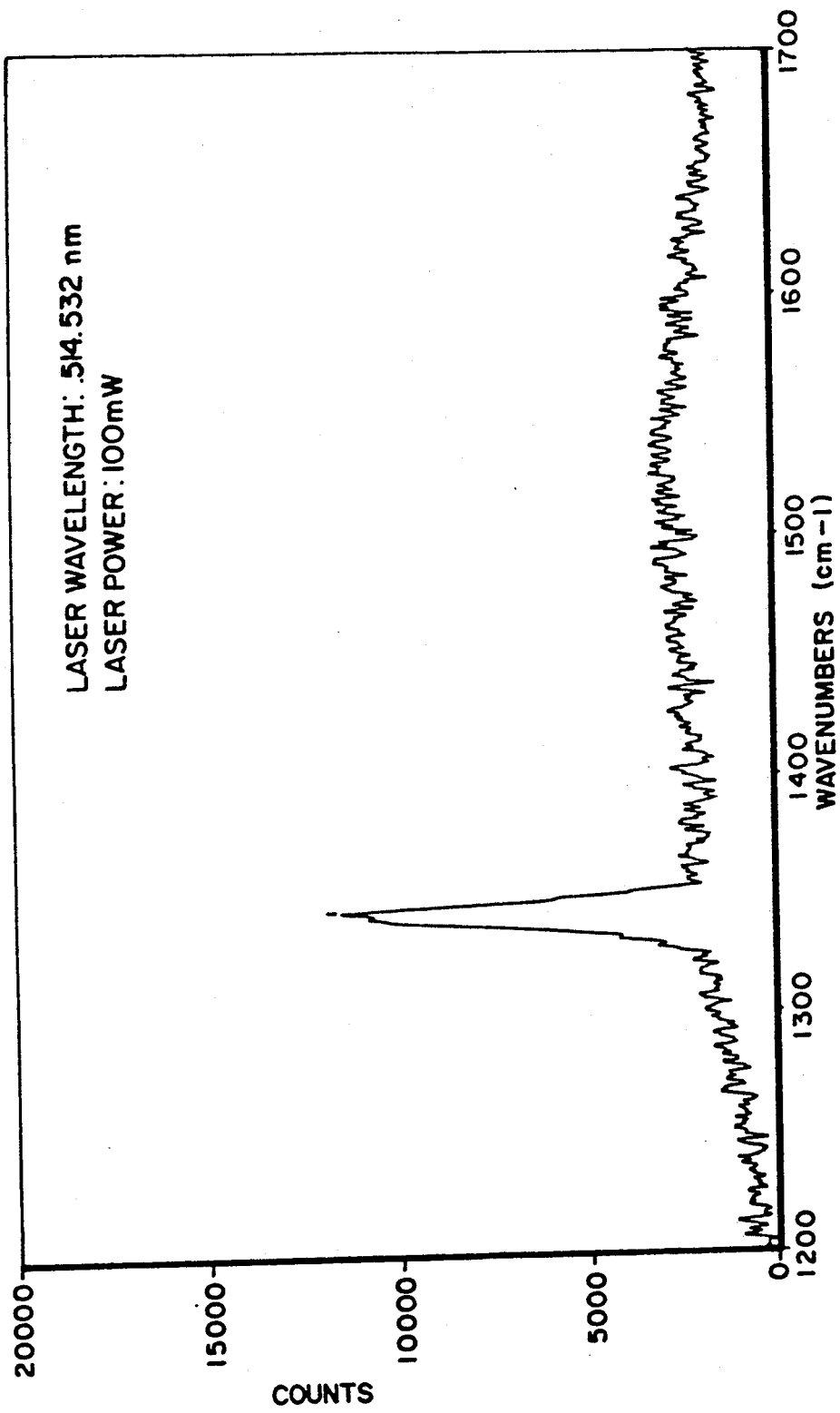

The polycrystalline diamond (PCD) films deposited in these experiments were analyzed by Laser Raman Spectroscopy to determine their nature. The Laser Raman spectra of some of the PCD films of the present invention are shown in FIGS. 2 through 10 and the films of Controls N and O are shown in FIGS. 11 and 12. Each of the spectra showed a strong peak at approximately 1332 cm$^{-1}$ which is a characteristic feature of crystalline diamond. The data also indicated the presence of a minor hump in a few films around 1580 cm$^{-1}$, indicating the presence of amorphous carbon in the film. (It must be borne in mind while interpreting the data that the Laser Raman response to amorphous carbon is about 50 times that of diamond.) The size of the hump at approximately 1580 cm$^{-1}$ was, however, very small, suggesting that the quantity of the amorphous carbon present in these films was rather small. The Laser Raman Spectroscopy therefore confirmed these films to be comprised primarily of crystalline diamond.

The PCD films deposited on the specimens were sectioned and analyzed metallographically to determine their thickness. The specimens were found to have a molybdenum carbide interlayer of 2 μm to 5 μm thickness. Additionally, the specimens were found to be deposited with 4 μm to 10 μm thickness diamond coating, as shown in Table 1.

The PCD films were characterized by x-ray diffraction to determine the orientation of the crystals. The results of the x-ray diffraction are summarized in Table 2. The orientation of crystals in the industrial grade diamond is also shown in Table 2 for reference purposes. This value has been obtained from the powder diffraction card #PDF 6-675 and represents a random distribution of (HKL) intensities.

Figure 13:
FIGS. 13-14 are scanning electron micrographs at 5000 times magnification of polycrystalline diamond films deposited by HFCVD on molybdenum by prior art techniques.
Figure 14:
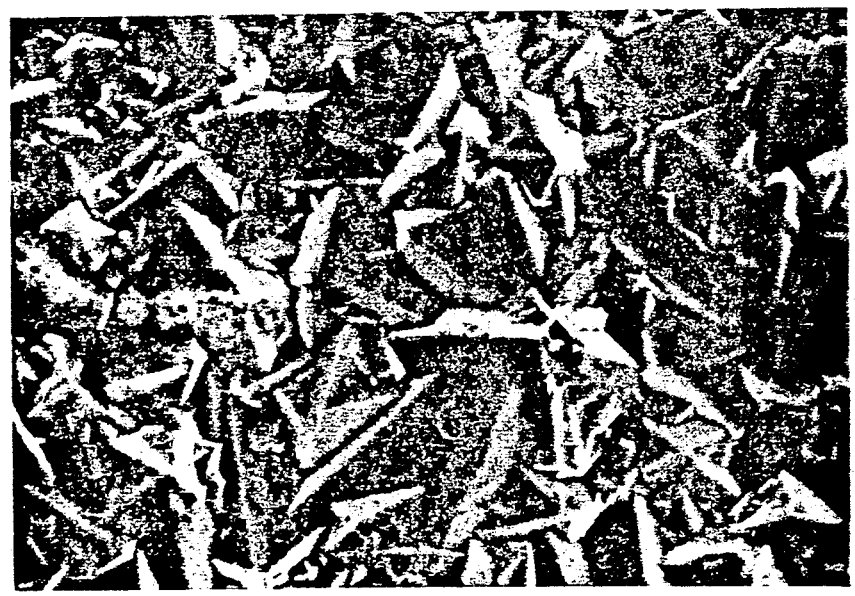
Figure 15:
FIGS. 15-28 are scanning electron micrographs at 5000 times magnification of polycrystalline diamond films deposited by HFCVD on molybdenum according to the present invention.
Figure 16:
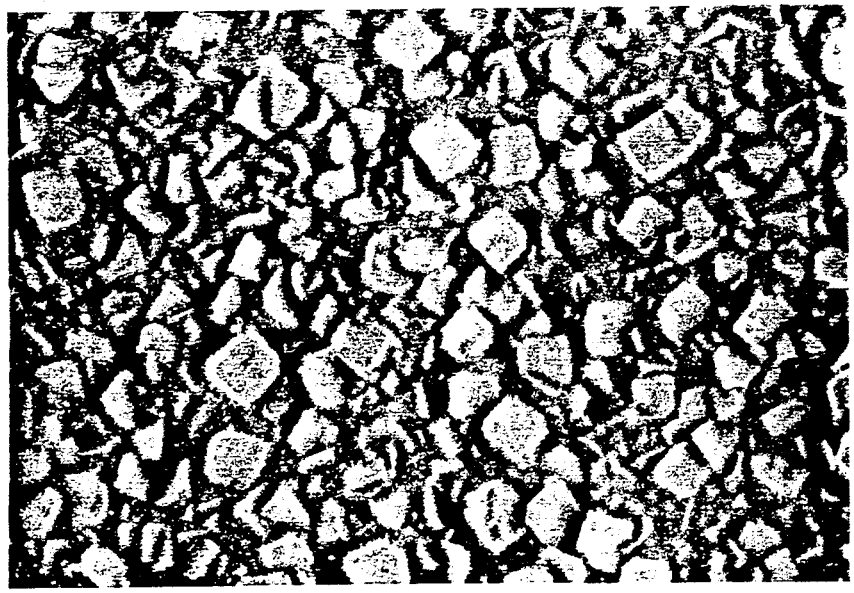
Figure 17:
Figure 18:
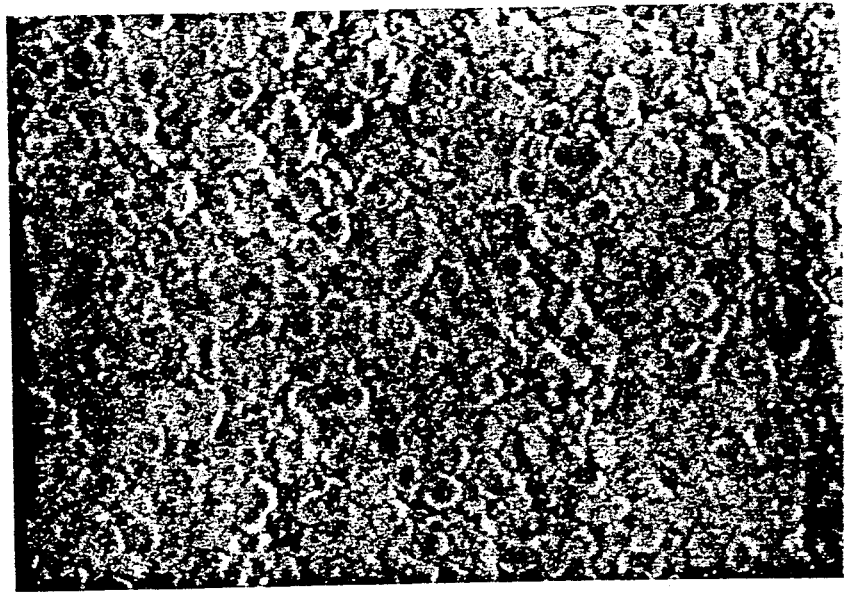
Figure 19:
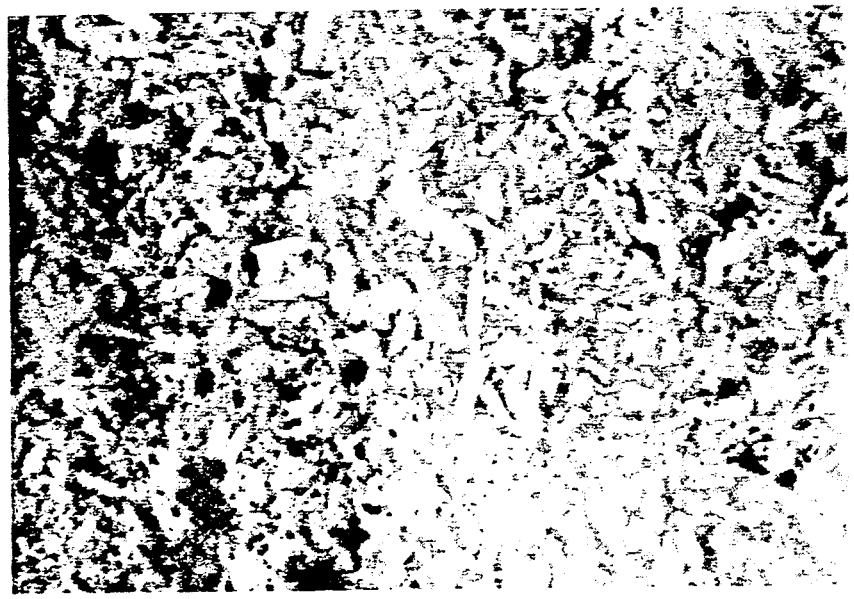
Figure 20:
Figure 21:
Figure 22:
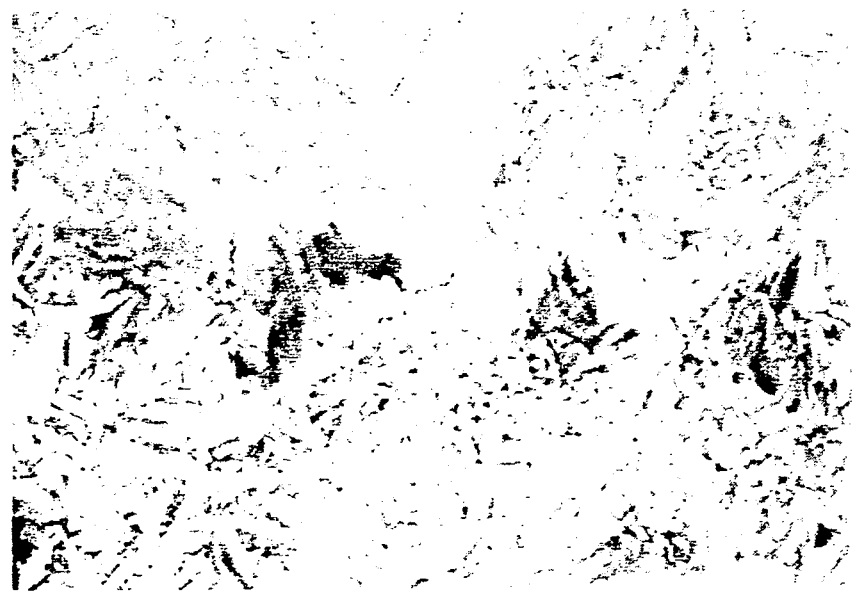
Figure 23:
Figure 24:
Figure 25:
Figure 26:
Figure 27:

The orientation of crystals in Controls N and O in which the specimen temperature was 830° and 850° C., respectively was marginally enhanced in the (220) and (400) directions relative to the (111) direction. However, the (400) peak intensity for the controls was very close to that noted in industrial grade diamond powder (random orientation). The surface finish of these PCD control films was noted to be very poor, as shown by the scanning electron micrographs at 5000 times magnification in FIGS. 13 and 14.

The PCD films in Examples A to M, on the other hand, were found to be greatly enhanced in the (220) and (400) directions relative to the (111) direction, as shown in Table 2. The PCD films in Examples A to E and G were also greatly enhanced in the (311) direction compared to the (111) direction, as shown in Table 2. Furthermore, the PCD films produced in Examples A to M exhibited a smoother surface finish compared to the finish produced in Controls N and 0, as shown in the scanning electron micrographs at 5000 times magnification (see FIGS. 15-27).

The electrical properties of the PCD films (measured through the thickness, i.e., in the direction perpendicular to the substrate surface) are summarized in Table 2. It is noted that the films of Controls N and O, which were marginally enhanced in the (220) and (400) directions relative to the (111) direction, showed low electrical resistivity and low breakdown voltage values. Contrary to these low resistivity and breakdown voltage values, the PCD films of Examples A-M of the present invention whose crystals were greatly enhanced in the (220) and (400) directions or the (220), (311) and (400) directions showed very high electrical resistivity and breakdown voltage values.

The PCD films deposited in Control O and in Examples H and L were analyzed for hydrogen content by using the Nitrogen Nuclear Reaction (NNR) analysis technique. The film in Control O was found to contain 0.2 atomic percent hydrogen. This amount is low and is believed not to cause a reduction in electrical properties of film produced in Control O. Contrary to this, the films produced in Examples H and L were found to contain 0.4 and 0.3 atomic percent hydrogen, respectively. Despite the fact that films produced in Examples H and L contained higher amounts of hydrogen than the Control O film, their electrical properties were far superior to Control O film. This information indicated that the hydrogen content of the film was not as important as claimed in papers by K. V. Ravi and M. I. Landstrauss is different) referred to above under the Background of the Invention. Furthermore, the foregoing data leads to the conclusion that the improvements in the electrical properties had to be related to enhancements in crystal orientation in the (220) and (400) directions or (220), (311) and (400) directions.

Figure 29:
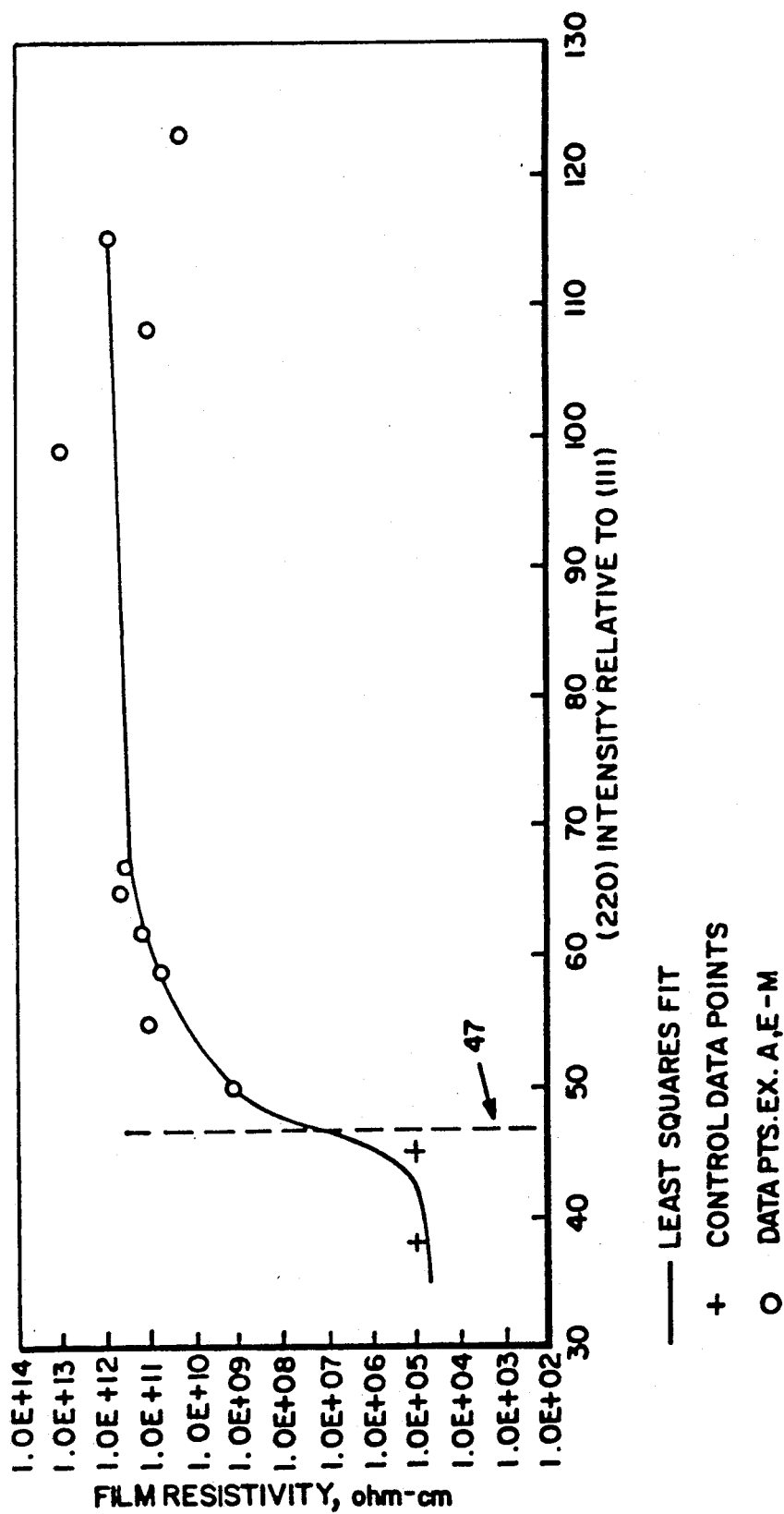
FIGS. 29-30 are graphs of electrical resistivity versus polycrystalline diamond film crystal orientation in (220) and (400) directions, respectively, according to the present invention.
Figure 30:
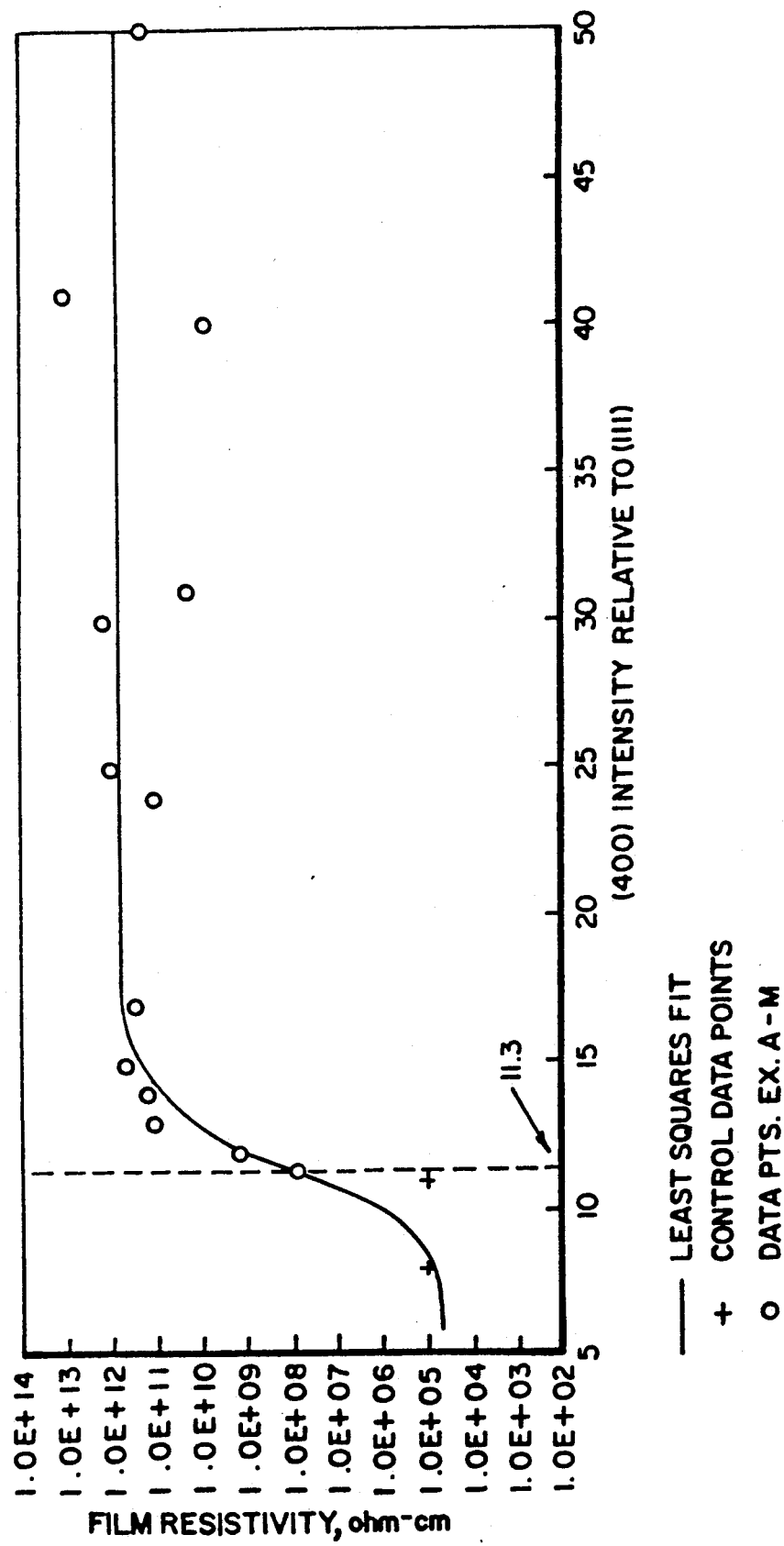

The electrical resistivities of the PCD films were plotted against crystal enhancement of the films in the (220) and (400) directions, as shown in FIGS. 29 and 30, respectively. FIGS. 29 and 30 show an increase in film resistivity with an increase in crystal orientation of the films in the (220) and (400) directions. These figures also indicate that the relative intensity of crystals in the (220) and (400) directions has to be greater than or equal to approximately 47 and approximately 11.3, respectively, to deposit PCD film with high electrical resistivity and high breakdown voltage. i.e., greater than $1 \times 10^6$ Ohm-cm. and 100 volts, respectively.

Figure 31:
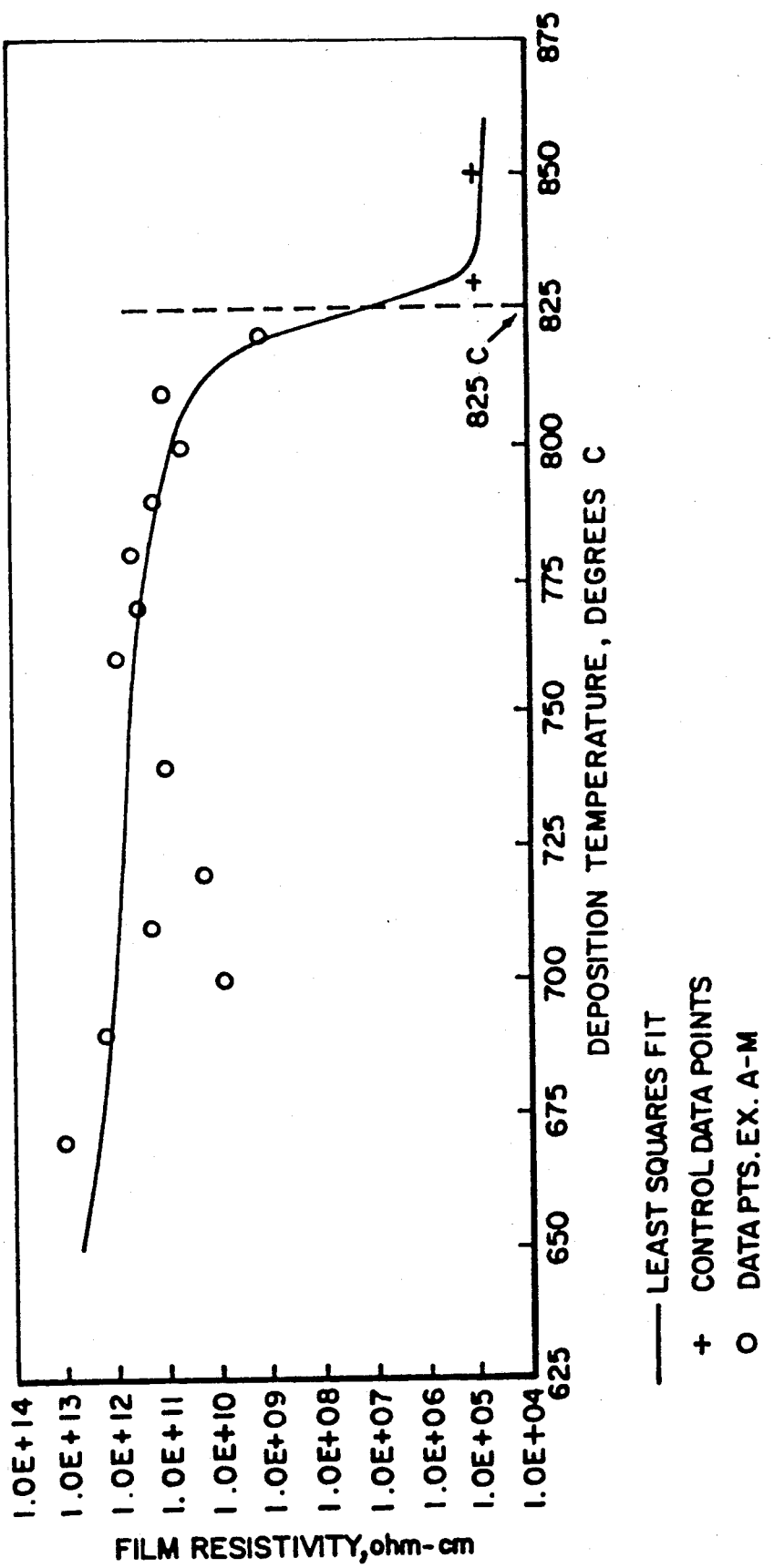
FIG. 31 is a graph of electrical resistivity versus deposition temperature of polycrystalline diamond films deposited by HFCVD on molybdenum according to the present invention.

The electrical resistivities of the PCD films produced in Examples A-M and Controls N and O were plotted against the deposition temperature, as shown in FIG. 31. FIG. 31 indicates that the deposition temperature has to be controlled below approximately 825° C. to produce PCD films with enhanced crystal orientation, high electrical resistivity and high breakdown voltage. This is an unexpected and significant finding.

EXAMPLE P

Figure 28:
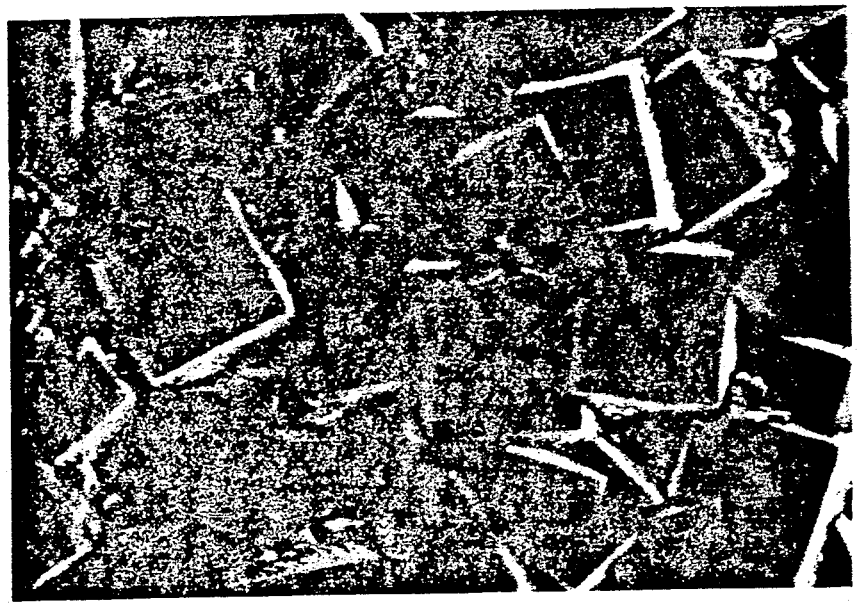

Another PCD deposition experiment described in Table 1 was carried out in an HFCVD reactor of the type illustrated in FIG. 1. Two molybdenum specimens similar to those described in Examples A to M and Controls N and O were placed on a holder and deposited with diamond using a filament temperature ranging from 2200° to 2220° C., a substrate temperature varying from 808° to 820° C., 30 torr total pressure, and 10 SCCM of 1% CH$_4$ in hydrogen for approximately 14 hours. The specimens were pre-etched with diamond slurry also using the foregoing procedure. Each of the coated specimens had an extremely smooth surface finish, as shown in FIG. 28. Furthermore, the specimens had about 4 μm thick interfilms of molybdenum carbide underneath the about 9 μm thick film of diamond. The crystals in the PCD film were strongly oriented in the (220), (311), and (400) directions relative to the (111) direction, as shown in Table 2. Although the electrical properties of the film were not measured, they are expected to be excellent. This example therefore showed that highly oriented PCD films with excellent electrical properties and good surface finish can be deposited using low deposition temperatures.

EXAMPLE O

Another PCD deposition experiment was carried out in an HFCVD reactor of the type illustrated in FIG. 1. In this experiment, two 1.35 inch long × 0.387 inch wide pieces of silicon wafer were placed on the holder. The pieces were etched with a diamond slurry containing 80 μm diamond particles in ethyl alcohol for 1 hour prior to deposition. They were then heated to 750° C. temperature using a filament made of ~ 1 mm diameter tantalum wire, which was placed ~ 10 mm above the specimens. The filament was heated to ~ 1950° C. temperature using an AC power supply. A flow of ~ 10 SCCM of 1% methane in hydrogen was used to deposit diamond for 20 hours. After the deposition time, the flow of feed gas was switched from 10 SCCM of 1% CH$_4$ in H$_2$ to 50 SCCM of He. The filament power was turned off after ~ ½ hour and the coated pieces were cooled under the flow of the gas.

Figure 32:
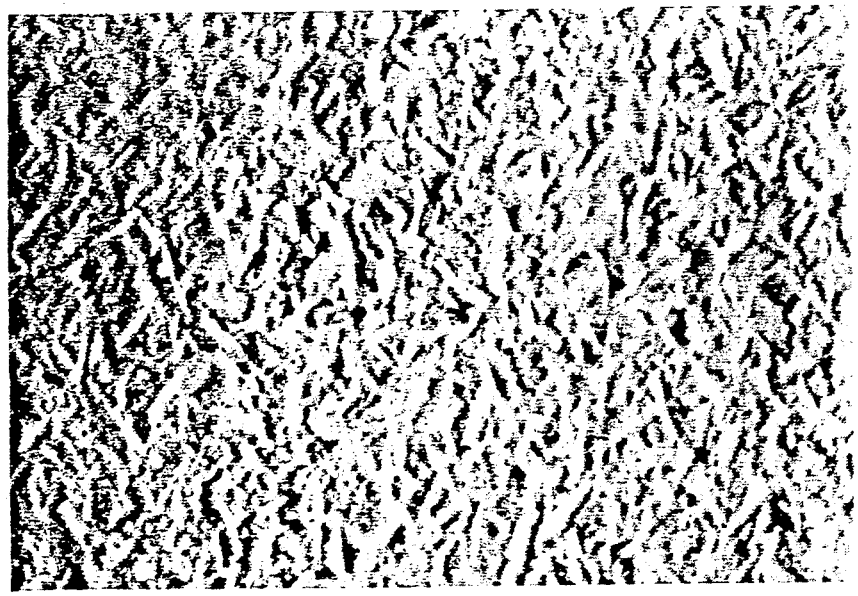
FIG. 32 is a scanning electron micrograph at 5000 times magnification of polycrystalline diamond film deposited by HFCVD on silicon according to the present invention.

The silicon pieces were found to have a silicon carbide interlayer of ≦ 1 μm in thickness. Additionally, the pieces were found to be deposited with uniform, adherent and ~ 4 μm thick diamond coating. The coating had a smooth surface finish as shown in FIG. 32. X-ray diffraction analysis revealed enhanced crystals orientation in the (311) and (400) directions (see Table 3). Furthermore, the PCD film showed extremely high electrical resistivity, as shown in Table 3.

This example, therefore, showed that PCD film with enhanced crystals orientation in the (311) and (400) directions and excellent electrical properties can be deposited on silicon substrate.

TABLE 3

| Crystal Orientation and Electrical Properties | | |
|---|---|---|
| Example | O | Industrial Grade Diamond Powder |
| Intensity of (hkl) inflection relative to (111)% | | |
| (220) | 22 | 25 |
| (311) | 26 | 16 |
| (400) | 13 | 8 |
| Resistivity, ohm-cm | $3.0 \times 10^{10}$ | — |

From the foregoing description, one of Ordinary skill in the art can easily ascertain that the present invention provides a novel method for producing diamond-on-substrate products comprised of a substrate which could be a single crystal, a polycrystalline material, metal, metal alloy, a mixture of metals or ceramic material, and a polycrystalline diamond film with an enhanced crystal orientation in the (220) and (400) directions or the (220), (311) and (400) directions relative to (111) direction. The invention makes it possible to fully utilize the electrical properties of polycrystalline diamond to provide electrical isolation of one electronic device and circuit from another and from the base substrate.

GENERAL DISCUSSION

The poor electrical properties of Controls N and O could be related to random crystal orientation, the impurities present in the grain boundaries, and structural imperfections such as large number of stacking faults and twins lying on the (111) plane of the film. The improvement in the electrical properties of the films in Examples A to M are related to the enhanced crystal orientation in the (220) and (400) directions or (220), (311) and (400) directions, relative to (111). It could also be related to the reduction in the impurities present in the grain boundaries and lower degree of structural imperfections such as lower number of stacking faults and twins lying on the (111) plane of the film. Improved electrical properties could also be related to reduction in the total number of inter-connected grain boundaries. In general, the PCD films with enhanced crystal orientation in the (220) and (400) directions or (220), (311) and (400) directions may have a greater degree of crystalline perfection, resulting in PCD films with improved electrical properties compared to randomly oriented films.

Without the departing from the spirit and scope of this invention, one of ordinary skill can make various changes and modification(s) to the invention to adapt it to various usages and conditions. As such, these changes and modifications are properly, equitably, and intended to be, within the full range of equivalence of the following claims.

TABLE 1

| Example | A | B | C | D | E | F | G | H |
|---|---|---|---|---|---|---|---|---|
| Experiment No. | 57-2 | 54-2 | 53-2 | 52-2 | 51-2 | 49-2 | 35-2 | 34-2 |

TABLE 1-continued

| Filament Temp., °C | ~1850 | ~2060 | ~2100 | ~2110 | ~2140 | ~2150 | ~2160 | ~2160 |
|---|---|---|---|---|---|---|---|---|
| Substrate Temp., °C | 670 | 690 | 700 | 710 | 720 | 740 | 760 | 770 |
| Flow Rate of 1% $CH_4$ in $H_2$ SCCM | 10 | 10 | 10 | 10 | 10 | 10 | 10 | 10 |
| Total Pressure, Torr | 30 | 30 | 30 | 30 | 30 | 30 | 30 | 30 |
| Deposition Time, Hours | ~19 | ~15 | ~15 | ~15 | ~15 | ~15 | ~15 | ~15 |
| Thickness, mm | | | | | | | | |
| Molybdenum carbide | ~2 | ~2 | ~2 | ~3 | ~2 | ~2 | ~3 | ~3 |
| Diamond | ~5 | ~4 | ~5 | ~4 | ~6 | ~7 | ~10 | ~10 |

| Example | I | J | K | L | M | CONTROL N | CONTROL O | P |
|---|---|---|---|---|---|---|---|---|
| Experiment No. | 33-2 | 32-2 | 31-2 | 30-2 | 29-2 | 36-2 | 28-2 | 6-2 |
| Filament Temp., °C | ~2170 | ~2190 | ~2200 | ~2210 | ~2230 | ~2230 | ~2260 | 2200-2220 |
| Substrate Temp., °C | 780 | 790 | 800 | 810 | 820 | 830 | 850 | 808-820 |
| Flow Rate of 1% $CH_4$ in $H_2$ SCCM | 10 | 10 | 10 | 10 | 10 | 10 | 10 | 10 |
| Total Pressure, Torr | 30 | 30 | 30 | 30 | 30 | 30 | 30 | 30 |
| Deposition Time, Hours | ~15 | ~15 | ~15 | ~15 | ~15 | ~15 | ~15 | ~14 |
| Thickness, mm | | | | | | | | |
| Molybdenum carbide | ~4 | ~5 | ~5 | ~5 | ~4 | ~4 | ~5 | ~4 |
| Diamond | ~9 | ~10 | ~8 | ~10 | ~10 | ~10 | ~8 | ~9 |

TABLE 2
Crystal Orientation and Electrical Properties

| | Example | | | | | | | |
|---|---|---|---|---|---|---|---|---|
| | A | B | C | D | E | F | G | H |
| Intensity of (hkl) reflection relative to $(111)^1$ (%) | | | | | | | | |
| $(220)^3$ | 99 | 151 | 167 | 263 | 123 | 108 | 115 | 67 |
| (311) | 20 | 23 | 27 | 32 | 26 | 17 | 28 | 15 |
| $(400)^4$ | 41 | 30 | 40 | 50 | 31 | 24 | 25 | 17 |
| Electrical Properties | | | | | | | | |
| Resistivity, ohm-cm | $1.0 \times 10^{13}$ | $1.3 \times 10^{12}$ | $7.7 \times 10^{9}$ | $1.9 \times 10^{11}$ | $2.0 \times 10^{10}$ | $1.0 \times 10^{11}$ | $8.2 \times 10^{11}$ | $2.9 \times 10^{11}$ |
| Breakdown voltage, volts | — | — | — | — | — | — | >800 | >800 |

| | Example | | | | | | | | Grade Powder[2] |
|---|---|---|---|---|---|---|---|---|---|
| | I | J | K | L | M | N | O | P | |
| Intensity of (hkl) reflection relative to $(111)^1$ (%) | | | | | | | | | |
| $(220)^3$ | 65 | 62 | 59 | 55 | 50 | 45 | 38 | 185 | 25 |
| (311) | 14 | 11 | 12 | 12 | 11 | 11 | 7 | 19 | 16 |
| $(400)^4$ | 15 | 14 | 14 | 13 | 12 | 11 | 8 | 39 | 8 |
| Electrical Properties | | | | | | | | | |
| Resistivity, ohm-cm | $4.0 \times 10^{11}$ | $1.4 \times 10^{11}$ | $5.0 \times 10^{10}$ | $1.0 \times 10^{11}$ | $1.4 \times 10^{9}$ | $1.0 \times 10^{5}$ | $1.0 \times 10^{5}$ | — | — |
| Breakdown voltage, volts | | | | | | | | | |

What is claimed is:

1. A coated substrate product comprised of a parent substrate and a polycrystalline diamond layer;

said parent substrate comprising a material selected from the group consisting of a single crystal, polycrystalline materials, metal, metal alloy, mixture of metals, ceramic materials and mixtures thereof;

said polycrystalline diamond layer chemically vapor deposited on said parent substrate and having a smooth surface finish, at least a partially ordered crystal orientation on at least two planes in comparison to industrial grade of diamond powder, including those in the (220) and (400) directions relative to the (111) direction, and a high electrical resistivity and breakdown voltage and exhibiting an intensity of reflections in the (220) and (400) directions of at least 47 percent and 11.3 percent, respectively, relative to the (111) direction which is normalized to 100.

2. A coated substrate product according to claim 1 wherein said polycrystalline diamond layer has at least a partially ordered crystal orientation in the (311) direction relative to the (111) direction.

3. A coated substrate product according to claim 1 wherein said polycrystalline diamond layer is in the range of about 0.5 μm to about 250 μm in thickness.

4. A coated substrate product according to claim 1 wherein said polycrystalline diamond layer is in the range of about 0.5 μm to about 50 μm in thickness.

5. A coated substrate product according to claim 1 wherein said polycrystalline diamond layer is about 3 μm to about 15 μm in thickness.

6. A coated substrate product according to claim 1 wherein said polycrystalline diamond layer has an electrical resistivity greater than $10^6$ ohm-cm.

7. A coated substrate product according to claim 1 wherein said polycrystalline diamond layer has a breakdown voltage greater than 100 volts.

8. A coated substrate product according to claim 1 wherein said parent substrate is molybdenum.

9. A coated substrate product according to claim 8 wherein molybdenum carbide is formed in situ between said parent substrate and said polycrystalline diamond layer wherein the thickness of said molybdenum carbide is in the range of about 2 μm to about 5 μm.

10. A coated substrate product according to claim 1 wherein said parent substrate is silicon.

11. A coated substrate product according to claim 10 wherein silicon carbide is formed in situ between said parent substrate and said polycrystalline diamond layer wherein the thickness of said silicon carbide is in the range of $\leq 1$ μm.

12. A coated substrate product comprised of a parent substrate and a plurality of separately deposited polycrystalline diamond layers, each layer having a substantially uniform microstructure and having high electrical resistivity;

said parent substrate comprising a material selected from the group consisting of a single crystal, polycrystalline materials, metal, metal alloy, mixture of metals, ceramic materials and mixtures thereof;

said diamond layers comprising a first polycrystalline diamond layer chemically vapor deposited on said parent substrate during a first cycle of at least one set of two cycles, and having a smooth surface finish, at least a partially ordered crystal orientation on at least two planes in comparison to industrial grade of diamond powder, including those in the (220) and (400) directions relative to the (111) direction, and a high electrical resistivity and breakdown voltage and exhibiting an intensity of reflections in the (220) and (400) directions of at least 47 percent and 11.3 percent, respectively, relative to the (111) direction which is normalized to 100; and at least a second polycrystalline diamond layer chemically vapor deposited on the coated substrate during a second cycle in which the deposition process conditions are substantially different from those of the first cycle.

13. The product of claim 12 wherein the total thickness of said polycrystalline diamond layers is at least about 11 μm.

14. The product of claim 12 wherein the total thickness of said polycrystalline diamond layers is in the range of about 0.5 μm to about 250 μm.

15. The product of claim 12 wherein the total thickness of said polycrystalline diamond layers is in the range of about 0.5 μm to about 50 μm.

16. The product of claim 12 wherein said polycrystalline diamond layers have electrical resistivity greater than $10^6$ ohm-cm.

17. The product of claim 12 wherein said polycrystalline diamond layers have a breakdown voltage greater than 100 volts.

18. The product of claim 12 wherein said parent substrate is molybdenum.

19. The product of claim 18 wherein molybdenum carbide is formed in situ between said parent substrate and said polycrystalline diamond layer and wherein the thickness of said molybdenum carbide is in the range of about 2 μm to about 5 μm.

20. The product of claim 12 wherein said parent substrate is silicon.

21. The product of claim 20 wherein silicon carbide is formed in situ between said parent substrate and said polycrystalline diamond layer and wherein the thickness of said silicon carbide is in the range of $\leq 1$ μm.

22. The product of claim 12 wherein said second polycrystalline diamond layer has at least a partially ordered orientation in at least two planes in comparison to industrial grade diamond powder.

23. The product of product of claim 22 wherein the second polycrystalline diamond layer has a smooth surface finish, at least a partially ordered crystal orientation in the (220) and (400) directions relative to the (111) direction, and a high electrical resistivity and breakdown voltage and exhibits an intensity of reflections in the (220) and (400) directions of at least 47 percent and 11.3 percent, respectively, relative to the (111) direction which is normalized to 100.

24. The product of claim 23 wherein said second polycrystalline diamond layer includes at least a partially ordered crystal orientation in the (311) direction relative to the (111) direction.

25. The product of claim 12 wherein said second polycrystalline diamond layer has at least a partially ordered crystal orientation in the (311) and (400) directions relative to the (111) direction.

* * * * *